US012635295B2

(12) United States Patent
Lee et al.

(10) Patent No.: US 12,635,295 B2
(45) Date of Patent: May 19, 2026

(54) DISPLAY APPARATUS HAVING A LIGHT-EMITTING DEVICE AND METHOD OF FORMING THE SAME

(71) Applicant: LG Display Co., Ltd., Seoul (KR)

(72) Inventors: Jung Eun Lee, Paju-si (KR); Nam Kook Kim, Paju-si (KR); Hwan Keon Lee, Paju-si (KR); Tae Gyu Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 300 days.

(21) Appl. No.: 18/354,421

(22) Filed: Jul. 18, 2023

(65) Prior Publication Data

US 2024/0047611 A1 Feb. 8, 2024

(30) Foreign Application Priority Data

Aug. 2, 2022 (KR) ........................ 10-2022-0096113

(51) Int. Cl.
| | |
|---|---|
| *H10H 20/821* | (2025.01) |
| *H10H 20/01* | (2025.01) |
| *H10H 20/831* | (2025.01) |
| *H10H 20/84* | (2025.01) |

(52) U.S. Cl.
CPC .......... *H10H 20/821* (2025.01); *H10H 20/01* (2025.01); *H10H 20/8312* (2025.01); *H10H 20/8316* (2025.01); *H10H 20/84* (2025.01)

(58) Field of Classification Search
None
See application file for complete search history.

(56) References Cited

U.S. PATENT DOCUMENTS

| | | | |
|---|---|---|---|
| 10,672,848 B2 | 6/2020 | Lee et al. | |
| 11,063,101 B2* | 7/2021 | Kim ..................... | H10K 59/131 |
| 2009/0127440 A1* | 5/2009 | Nakai .................. | G02B 3/0012 |
| | | | 430/4 |
| 2012/0146886 A1* | 6/2012 | Minami .............. | H10K 59/131 |
| | | | 345/80 |

(Continued)

FOREIGN PATENT DOCUMENTS

| | | |
|---|---|---|
| JP | 2008-203592 A | 9/2008 |
| JP | 2008-298937 A | 12/2008 |

(Continued)

*Primary Examiner* — Bilkis Jahan
(74) *Attorney, Agent, or Firm* — Seed Intellectual Property Law Group LLP

(57) ABSTRACT

A display apparatus including a light-emitting device and a method of forming the same are provided. The light-emitting device may be electrically connected to the driving circuit. A first planarization layer may be disposed on the driving circuit, a second planarization layer may be disposed on the first planarization layer, and the light-emitting device may be disposed on the second planarization layer. An upper surface of the second planarization layer toward the light-emitting device may be parallel with a surface of a device substrate supporting the light-emitting device and the driving circuit. Thus, in the display apparatus and the method of forming the same, decreasing the quality of an image due to differences in the generation position of the light emitted from the light-emitting device may be prevented.

18 Claims, 15 Drawing Sheets

(56)  References Cited

U.S. PATENT DOCUMENTS

| | | | | |
|---|---|---|---|---|
| 2014/0117336 A1* | 5/2014 | Kim | ............... | H10K 59/8722 |
| | | | | 257/40 |
| 2014/0217397 A1* | 8/2014 | Kwak | ............... | H10D 86/441 |
| | | | | 257/43 |
| 2018/0123088 A1* | 5/2018 | Kim | ............... | H10K 71/191 |
| 2018/0269261 A1* | 9/2018 | Park | ............... | H10K 59/873 |
| 2019/0041915 A1* | 2/2019 | Park | ............... | G02F 1/133305 |

FOREIGN PATENT DOCUMENTS

| | | | |
|---|---|---|---|
| KR | 10-2011-0132816 A | 12/2011 | |
| KR | 10-2018-0021286 A | 3/2018 | |
| KR | 10-2020-0145978 A | 12/2020 | |
| KR | 10-2021-0010782 A | 1/2021 | |
| KR | 10-2021-0045658 A | 4/2021 | |
| KR | 10-2022-0021985 A | 2/2022 | |

* cited by examiner

DISPLAY APPARATUS HAVING A LIGHT-EMITTING DEVICE AND METHOD OF FORMING THE SAME

CROSS-REFERENCE TO RELATED APPLICATIONS

This application claims the benefit of Korean Patent Application No. 10-2022-0096113, filed on Aug. 2, 2022, which is hereby incorporated by reference as if fully set forth herein.

BACKGROUND

Technical Field

The present disclosure relates to a display apparatus in which a light-emitting device and a driving circuit are disposed in each pixel area, and a method of forming the same.

Description of the Related Art

Generally, a display apparatus provides an image to a user. For example, the display apparatus may include a plurality of pixel areas. Each of the pixel areas may realize a specific color. For example, a light-emitting device may be disposed in each pixel area. The light-emitting device may emit light displaying a specific color. For example, the light-emitting device may include a first electrode, a light-emitting layer and a second electrode, which are sequentially stacked on a device substrate.

A driving circuit electrically connected to the light-emitting device may be disposed in each pixel area. The driving circuit may control the operation of the light-emitting device. For example, the driving circuit of each pixel area may supply a driving current corresponding to a data signal to the light-emitting device of the corresponding pixel area according to a gate signal. The light-emitting device may be disposed on a layer different from the driving circuit. For example, the light-emitting device may be disposed on a planarization layer covering the driving circuit.

However, in the display apparatus, an upper surface of the planarization layer toward the light-emitting device may have a curvature. Thus, in the display apparatus, a vertical distance between the device substrate supporting the driving circuit and the light-emitting device and the light-emitting layer of the light-emitting device may be not constant in an emission area. That is, in the display apparatus, the luminance deviation due to differences in the generation position of the light emitted from the light-emitting device may occur. Therefore, in the display apparatus, the quality of the image may be decreased.

BRIEF SUMMARY

Accordingly, the present disclosure is directed to a display apparatus that substantially obviates one or more problems due to limitations and disadvantages of the related art.

An object of the present disclosure is to provide a display apparatus capable of preventing decreasing the quality of the image due to differences in the generation position of the light emitted from the light-emitting device, and a method of forming the same.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the present disclosure, as embodied and broadly described herein, there is provided a display apparatus comprising a device substrate. The device substrate includes a first circuit area and a non-circuit area. The non-circuit area is disposed outside the circuit area. A thin film transistor is disposed on the first circuit area of the device substrate. A first planarization layer is disposed on the thin film transistor. The first planarization layer extends on the non-circuit area. A second planarization layer is disposed on the first planarization layer. An upper surface of the second planarization layer is flat. A light-emitting device is disposed on the upper surface of the second planarization layer. The light-emitting device has a stacked structure of a first electrode, a light-emitting layer and a second electrode. A first minimum distance between an upper surface of the first planarization layer and the upper surface of the second planarization layer in the first circuit area is smaller than a second minimum distance between the upper surface of the first planarization layer and the upper surface of the second planarization layer in the non-circuit area.

The first electrode of the light-emitting device may be in contact with the upper surface of the second planarization layer.

An over-coat layer may be disposed between the thin film transistor and the first planarization layer. The over-coat layer may extend on the non-circuit area. A connection electrode may be disposed between the over-coat layer and the first planarization layer. The first electrode of the light-emitting device may be electrically connected to the thin film transistor by the connection electrode. The non-circuit area of the device substrate may be disposed outside the connection electrode.

The upper surface of the first planarization layer may have a more gentle curvature than an upper surface of the over-coat layer.

A portion of the second planarization layer overlapping with the connection electrode may have a thickness smaller than a portion of the second planarization layer overlapping with the non-circuit area.

The second planarization layer may include a material different from the first planarization layer.

The device substrate may include a second circuit area disposed outside the first circuit area and the non-circuit area. A storage capacitor may be disposed between the second circuit area of the device substrate and the first planarization layer. A third minimum distance between the upper surface of the first planarization layer and the upper surface of the second planarization layer in the second circuit area may be smaller than the second minimum distance.

The third minimum distance may be larger than the first minimum distance.

An encapsulation unit may be disposed on the light-emitting device. The encapsulation unit may overlap the first circuit area and the non-circuit area. A color filter may be disposed on the color filter. The color filter may overlap the light-emitting device. An upper surface of the color filter may be flat.

A black matrix may be disposed on the encapsulation unit. The black matrix may be disposed side by side with the color filter. An upper surface of the black matrix may be continuously with an upper surface of the color filter.

To achieve these objects and other advantages and in accordance with the purpose of the present disclosure, as embodied and broadly described herein, there is provided a method of forming a display device comprising a step of preparing a device substrate including a circuit area and a non-circuit area spaced apart from the circuit area, a step of forming a driving circuit on the circuit area of the device substrate, a step of forming a first planarization layer covering the driving circuit and overlapping with the non-circuit area on the device substrate, a step of forming a preliminary planarization layer on the first planarization layer, a step of forming a second planarization layer having a flat upper surface by planarizing an upper surface of the preliminary planarization layer opposite to the device substrate, and a step of forming a light-emitting device on the upper surface of the second planarization layer.

The step of forming the second planarization layer may include a step of planarizing the upper surface of the preliminary planarization layer by chemical mechanical polishing (CMP) process.

An encapsulation unit covering the light-emitting device may be formed on the device substrate. A black matrix disposed outside the light-emitting device and a color filter overlapping with the light-emitting device may be formed on the encapsulation unit. A step of forming the color filter may include a step of forming a preliminary color filter in a region defined by the black matrix and a step of planarizing an upper surface of the preliminary color filter.

An upper surface of the black matrix may be continuously with the upper surface of the color filter by a process of planarizing the upper surface of the preliminary color filter.

An over-coat layer covering the driving circuit may be formed between the device substrate and the first planarization layer. A connection electrode electrically connected to the driving circuit may be formed between the over-coat layer and the first planarization layer. The light-emitting device may be formed to be electrically connected to the connection electrode by penetrating the first planarization layer and the second planarization layer.

BRIEF DESCRIPTION OF THE SEVERAL VIEWS OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings.

DETAILED DESCRIPTION

Figure 1:
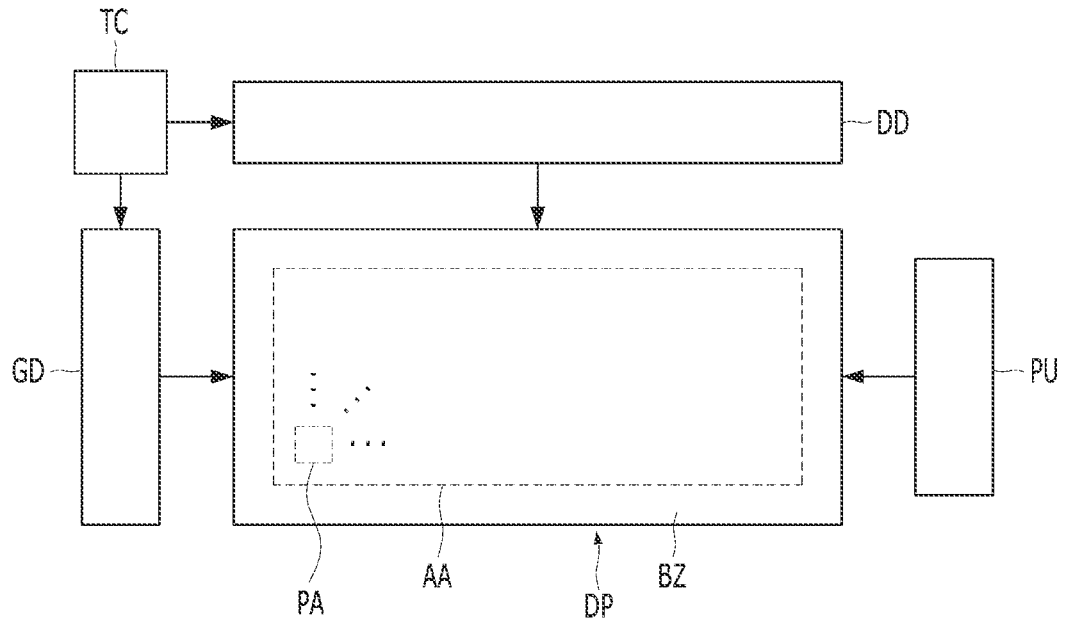
FIG. 1 is a view schematically showing a display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

And, unless 'directly' is used, the terms "connected" and "coupled" may include that two components are "connected" or "coupled" through one or more other components located between the two components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

EMBODIMENT

Figure 2:
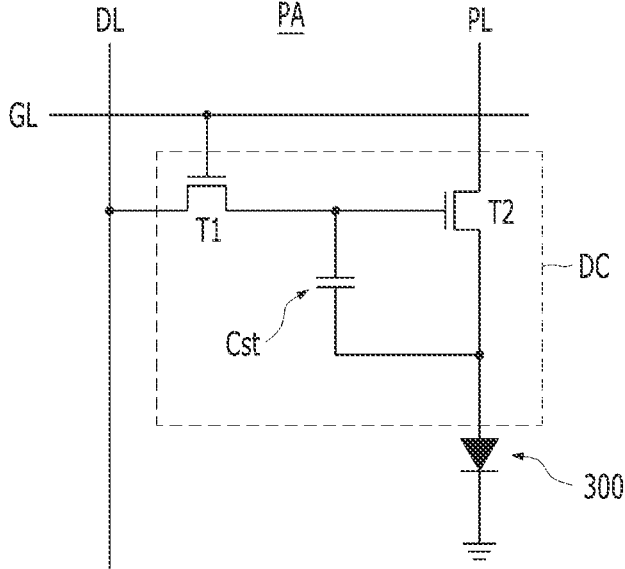
FIG. 2 is a view showing a circuit of a unit pixel area in the display apparatus according to the embodiment of the present disclosure.
Figure 3:
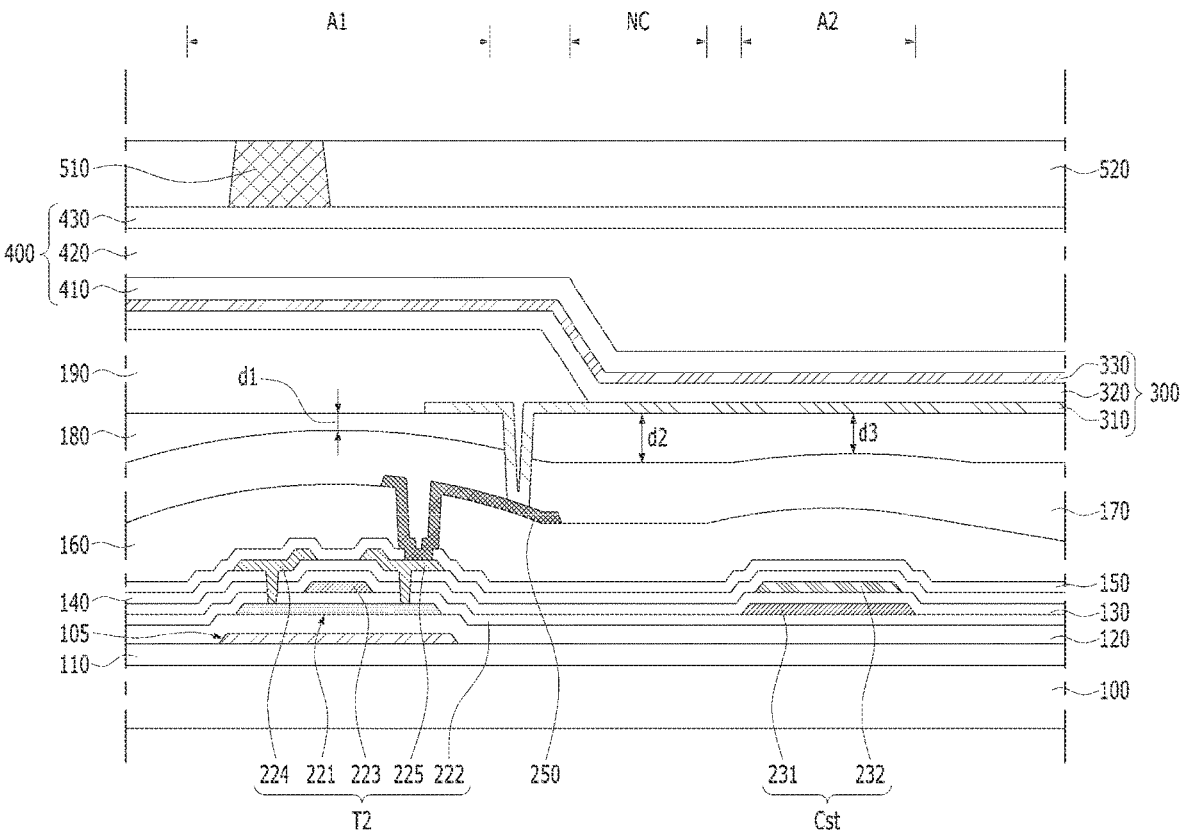
FIG. 3 is a view schematically showing a cross-section of the pixel area in the display apparatus according to the embodiment of the present disclosure.

FIG. 1 is a view schematically showing a display apparatus according to an embodiment of the present disclosure. FIG. 2 is a view showing a circuit of a unit pixel area in the display apparatus according to the embodiment of the present disclosure. FIG. 3 is a view schematically showing a cross-section of the pixel area in the display apparatus according to the embodiment of the present disclosure.

Referring to FIGS. 1 to 3, the display apparatus according to the embodiment of the present disclosure may include a display panel DP. The display panel DP may generate an image provided to a user. For example, the display panel DP may include a plurality of pixel areas PA.

The display panel DP may be electrically connected to a gate driver GD, a data driver DD and a power unit PU by signal wirings GL, DL and PL. The signal wirings GL, DL and PL may include gate lines GL applying a gate signal, data lines DL applying a data signal, and power lines PL supplying a power voltage. For example, the gate driver GD may sequentially apply the gate signal to each pixel area PA of the display panel DP through the gate lines GL, and the data driver DD may apply the data signal to each pixel area PA of the display panel DP through the data lines DL. The power voltage may be supplied to each pixel area PA of the display panel DP from the power unit PU through the power lines PL.

The gate driver GD and the data driver DD may be controlled by a timing controller. For example, the gate driver GD may receive clock signals, reset signals and a start signal from the timing controller, and the data driver may receive digital video data and a source timing signal from the timing controller.

Each of the pixel areas PA may realize a specific color having a luminance corresponding to the data signal according to the gate signal. For example, a light-emitting device 300 and a driving circuit DC may be disposed in each pixel area PA. The driving circuit DC of each pixel area PA may be electrically connected to the light-emitting device 300 of the corresponding pixel area PA. For example, the driving circuit DC of each pixel area PA may supply a driving current corresponding to the data signal to the light-emitting device 300 of the corresponding pixel area PA according to gate signal. The driving current supplied to the light-emitting device 300 by the driving circuit DC may be maintained for one frame. For example, the driving circuit DC of each pixel area PA may include a first thin film transistor T1, a second thin film transistor T2 and a storage capacitor Cst.

The first thin film transistor T1 may transmit the data signal to the second thin film transistor T2 according to the gate signal. The first thin film transistor T1 may include a first semiconductor pattern, a first gate insulating layer, a first gate electrode, a first source electrode and a first drain electrode. For example, the first gate electrode of the first thin film transistor T1 may be electrically connected to the gate line GL, and the first source electrode of the first thin film transistor T1 may be electrically connected to the date line DL.

The second thin film transistor T2 may have a same structure as the first thin film transistor T1. For example, the second thin film transistor T2 may include a second semiconductor pattern 221, a second gate insulating layer 222, a second gate electrode 223, a second source electrode 224 and a second drain electrode 225.

The second semiconductor pattern 221 may include a semiconductor material. For example, the second semiconductor pattern 221 may include at least one of amorphous silicon, polycrystalline silicon and an oxide semiconductor. The second semiconductor pattern 221 may include a source region, a drain region and a channel region. The channel region may be disposed between the source region and the drain region. The source region and the drain region may have a resistance lower than the channel region. For example, the source region and the drain region may include a conductive region of an oxide semiconductor. The channel region may be a region of an oxide semiconductor, which is not conductorized.

The second gate insulating layer 222 may be disposed on the second semiconductor pattern 221. The second gate insulating layer 222 may extend beyond the second semiconductor pattern 221. For example, a side of the second semiconductor pattern 221 may be covered by the second gate insulating layer 222. The second gate insulating layer 222 may include an insulating material. For example, the second gate insulating layer 222 may include an inorganic insulating material, such as silicon oxide (SiO) and silicon nitride (SiN).

The second gate electrode 223 may be disposed on the second gate insulating layer 222. The second gate electrode 223 may include a conductive material. For example, the second gate electrode 223 may include a metal, such as aluminum (Al), titanium (Ti), copper (Cu), molybdenum (Mo) and tungsten (W). The second gate electrode 223 may overlap the channel region of the second semiconductor pattern 221. For example, the second gate electrode 223 may be insulated from the second semiconductor pattern 221 by the second gate insulating layer 222. The channel region of the second semiconductor pattern 221 may have an electrical conductivity corresponding to a voltage applied to the second gate electrode 223.

The second source electrode 224 may include a conductive material. For example, the second source electrode 224 may include a metal, such as aluminum (Al), titanium (Ti), copper (Cu), molybdenum (Mo) and tungsten (W). The second source electrode 224 may include a material different from the second gate electrode 223. The second source electrode 224 may be disposed on a layer different from the second gate electrode 223. For example, a first interlayer insulating layer 130 may be disposed on the second gate electrode 223, and the second source electrode 224 may be disposed on the first interlayer insulating layer 130. The first interlayer insulating layer 130 may include an insulating material. For example, the first interlayer insulating layer 130 may include an inorganic insulating material, such as silicon oxide (SiO) and silicon nitride (SiN). The first interlayer insulating layer 130 may extend beyond the second gate electrode 223. For example, a side of the second gate electrode 223 may be covered by the first interlayer insulating layer 130.

The second source electrode 224 may be electrically connected to the source region of the second semiconductor pattern 221. For example, a source contact hole partially exposing the source region of the second semiconductor pattern 221 may penetrate the second gate insulating layer 222 and the first interlayer insulating layer 130, and the second source electrode 224 may be connected to the source region of the second semiconductor pattern 221 through the source contact hole. The second source electrode 224 may be in direct contact with the source region of the second semiconductor pattern 221 in the source contact hole.

The second drain electrode 225 may include a conductive material. For example, the second drain electrode 225 may include a metal, such as aluminum (Al), titanium (Ti), copper (Cu), molybdenum (Mo) and tungsten (W). The second drain electrode 225 may include a material different from the second gate electrode 223. The second drain electrode 225 may be disposed on a layer different from the second gate electrode 223. For example, the second drain electrode 225 may be disposed on the first interlayer insulating layer 130. The second drain electrode 225 may be disposed on a same layer as the second source electrode 224. For example, the second drain electrode 225 may include a same material as the second source electrode 224.

The second drain electrode 225 may be electrically connected to the drain region of the second semiconductor pattern 221. For example, a drain contact hole partially exposing the drain region of the second semiconductor pattern 221 may penetrate the second gate insulating layer 222 and the first interlayer insulating layer 130, and the second drain electrode 225 may be connected to the drain region of the second semiconductor pattern 221 through the drain contact hole. The second drain electrode 225 may be in direct contact with the drain region of the second semiconductor pattern 221 in the drain contact hole.

The second thin film transistor T2 may generate the driving current corresponding to the data signal transmitted by the first thin film transistor T1. For example, the second gate electrode 223 of the second thin film transistor T2 may be electrically connected to the first drain electrode of the first thin film transistor T1, and the second source electrode 224 of the second thin film transistor T2 may be electrically connected to the power line PL. The light-emitting device 300 may be electrically connected to the second drain electrode 225 of the second thin film transistor T2. For example, the second drain electrode 225 may function as a driving transistor supplying the driving current to the light-emitting device 300.

The storage capacitor Cst may maintain a signal applied to the second gate electrode 223 of the second thin film transistor T2 for one frame. For example, the storage capacitor Cst may be electrically connected between the second gate electrode 223 and the second drain electrode 225 of the second thin film transistor T2. The storage capacitor Cst may have a stacked structure of a first conductive pattern 231 and a second conductive pattern 232.

The first conductive pattern 231 may include a conductive material. For example, the first conductive pattern 231 may include a metal, such as aluminum (Al), titanium (Ti), copper (Cu), molybdenum (Mo) and tungsten (W). The first conductive pattern 231 may be electrically connected to the second gate electrode 223 of the second thin film transistor T2. For example, the first conductive pattern 231 may be disposed on a same layer as the second gate electrode 223. The first conductive pattern 231 may include a same material as the second gate electrode 223. For example, the first conductive pattern 231 may be formed simultaneously with the second gate electrode 223.

The second conductive pattern 232 may include a conductive material. The second conductive pattern 232 may include a metal, such as aluminum (Al), titanium (Ti), copper (Cu), molybdenum (Mo) and tungsten (W). The second conductive pattern 232 may be disposed on a layer different from the first conductive pattern 231. For example the second conductive pattern 232 may include a material different from the first conductive pattern 231.

The second conductive pattern 232 may include a region overlapping with the first conductive pattern 231. The second conductive pattern 232 may be insulated from the first conductive pattern 231. For example, the first interlayer insulating layer 130 may extend between the first conductive pattern 231 and the second conductive pattern 232.

The second conductive pattern 232 may include a material different from the second source electrode 224 and the second drain electrode 225. The second conductive pattern 232 may be disposed on a layer different from the second source electrode 224 and the second drain electrode 225. For example, a second interlayer insulating layer 140 may be disposed on the second conductive pattern 232, and the second source electrode 224 and the second drain electrode 225 may be disposed on the second interlayer insulating layer 140. The second interlayer insulating layer 140 may include an insulating material. For example, the second interlayer insulating layer 140 may include an inorganic insulating material, such as silicon oxide (SiO) and silicon nitride (SiN). The source contact hole and the drain contact hole may penetrate the second interlayer insulating layer 140.

The driving circuit DC of each pixel area PA may be disposed on a device substrate 100. The device substrate 100 may include an insulating material. For example, the device substrate 100 may include glass or plastic. The first thin film transistor T1, the second thin film transistor T2 and the storage capacitor Cst of each driving circuit DC may be disposed side by side on the device substrate 100. For example, the device substrate 100 may include a first circuit area A1 in which the first thin film transistor T1 and the second thin film transistor T2 of each driving circuit DC are disposed, a second circuit area A2 in which the storage capacitor Cst of each driving circuit DC is disposed, and a non-circuit area NC disposed between the first circuit area A1 and the second circuit area A2. The non-circuit area NC of each pixel area PA may not overlap the driving circuit DC of the corresponding pixel area PA. For example, the non-circuit area NC of each pixel area PA may be disposed outside the first circuit area A1 and the second circuit area A2 of the corresponding pixel area PA.

A first buffer insulating layer 110 may be disposed between the device substrate 100 and each of the driving circuit DC. The first buffer insulating layer 110 may prevent pollution due to the device substrate 100 in a process of forming the driving circuits DC. For example, an upper surface of the device substrate 100 toward the driving circuit DC of each pixel area PA may be completely covered by the first buffer insulating layer 110. The first buffer insulating layer 110 may include an insulating material. For example, the first buffer insulating layer 110 may include an inorganic insulating material, such as silicon oxide (SiO) and silicon nitride (SiN). The first buffer insulating layer 110 may have a multi-layer structure.

A light-blocking pattern 105 may be disposed between the device substrate 100 and the second thin film transistor T2 of each driving circuit DC. For example, the light-blocking pattern 105 of each pixel area PA may be disposed in the first circuit area A1 of the corresponding pixel area PA. The light-blocking pattern 105 of each pixel area PA may block the light travelling in a direction of the second semiconductor pattern 221 of the corresponding pixel area PA through the device substrate 100. The light-blocking pattern 105 may include a material that absorbs or reflects light. For example, the light-blocking pattern 105 may include a metal, such as aluminum (Al), titanium (Ti), copper (Cu), molybdenum (Mo) and tungsten (W). Thus, in the display apparatus according to the embodiment of the present disclosure, changes in characteristics of the second thin film transistor T2 in each pixel area PA due to external light may be prevented.

The light-blocking pattern 105 of each pixel area PA may overlap the second semiconductor pattern 221 of the corresponding pixel area PA. The light-blocking pattern 105 of each pixel area PA may be spaced apart from the second semiconductor pattern 221 of the corresponding pixel area PA. For example, a second buffer insulating layer 120 may be disposed on the light-blocking pattern 105 of each pixel area PA, and the second semiconductor pattern 221 of each driving circuit DC may be disposed on the second buffer insulating layer 120. The second buffer insulating layer 120 may include an insulating material. For example, the second buffer insulating layer 120 may include an inorganic insulating material, such as silicon oxide (SiO) and silicon nitride (SiN). The second buffer insulating layer 120 may extend beyond the light-blocking pattern 105 in the pixel area PA. For example, a side of each light-blocking pattern 105 may be covered by the second buffer insulating layer 120. The second buffer insulating layer 120 may be in direct contact with the first buffer insulating layer 110 at the outside of each light-blocking pattern 105.

A lower passivation layer 150 may be disposed on the driving circuit DC of each pixel area PA. The lower passivation layer 150 may prevent the damage of each driving circuit DC due to external impact and moisture. For example, the lower passivation layer 150 may extend along an upper surface of each driving circuit DC opposite to the device substrate 100. The first thin film transistor T1, the second thin film transistor T2 and the storage capacitor Cst of each driving circuit DC may be covered by the lower passivation layer 150. The lower passivation layer 150 may include an insulating material. For example, the lower passivation layer 150 may include an inorganic insulating material, such as silicon oxide (SiO) and silicon nitride (SiN). A thickness of the lower passivation layer 150 may be constant. For example, the lower passivation layer 150 may be a linear layer having a constant thickness extending along the upper surface of each driving circuit DC.

An over-coat layer 160 may be disposed on the lower passivation layer 150. The over-coat layer 160 may mitigate a thickness difference due to the driving circuit DC of each pixel area PA. For example, the over-coat layer 160 may overlap the first circuit area A1, the second circuit area A2 and the non-circuit area NC of each pixel area PA. The over-coat layer 160 may include a material different from the lower passivation layer 150. For example, the over-coat layer 160 may include an organic insulating material, such as acryl resin, epoxy resin, phenolic region, polyamide resin and polyimide resin.

At least one connection electrode 250 may be disposed on the over-coat layer of each pixel area PA. The connection electrode 250 may include a conductive material. For example, the connection electrode 250 may include a metal, such as aluminum (Al), titanium (Ti), copper (Cu), molybdenum (Mo) and tungsten (W). The first thin film transistor T1, the second thin film transistor T2 and the storage capacitor Cst of each driving circuit DC may be electrically connected each other by the connection electrode 250 in the corresponding pixel area PA. For example, connection contact holes partially exposing the second drain electrode 225 of each driving circuit DC may penetrate the over-coat layer 160, and the connection electrode 250 of each pixel area PA may be connected to the second drain electrode 225 of the corresponding pixel area PA through one of the connection contact holes. Thus, in the display apparatus according to the embodiment of the present disclosure, the degree of freedom for an arrangement of the first thin film transistor T1, the second thin film transistor T2 and the storage capacitor Cst in each pixel area PA may be improved.

The connection electrode 250 of each pixel area PA may include a region disposed outside the corresponding driving circuit DC. For example, an end of the connection electrode 250 in each pixel area PA may not overlap the first circuit area A1 and the second circuit area A2 of the corresponding pixel area PA. The connection electrode 250 of each pixel area PA may be spaced apart from the non-circuit area NC of the corresponding pixel area PA. For example, the non-circuit area NC of each pixel area PA may be disposed outside the connection electrode in the corresponding pixel area PA.

A first planarization layer 170 may be disposed on the connection electrode 250 of each pixel area PA. The first planarization layer 170 may extend beyond the connection electrodes 250. For example, the first planarization layer 170 may overlap the first circuit area A1, the second circuit area A2 and the non-circuit area NC of each pixel area PA. The first planarization layer 170 may mitigate a thickness difference due to the connection electrodes 250 and each of the driving circuits DC. For example, an upper surface of the first planarization layer 170 opposite to the device substrate 100 may have a more gentle curvature than an upper surface of the over-coat layer 160 opposite to the device substrate 100. A height deviation of the upper surface of the first planarization layer 170 may be smaller than a height deviation of the upper surface of the over-coat layer 160. The first planarization layer 170 may include an insulating material. For example, the first planarization layer 170 may include an organic insulating material. The first planarization layer 170 may include a material different from the over-coat layer 160.

A second planarization layer 180 may be disposed on the first planarization layer 170. The second planarization layer 180 may include an insulating material. For example, the second planarization layer 180 may include an organic insulating material. The second planarization layer 180 may include a material different from the first planarization layer 170.

The second planarization layer 180 may completely remove a thickness difference due to the connection electrodes 250 and each of the driving circuits DC. For example, an upper surface of the second planarization layer 180 opposite to the device substrate 100 may be a flat surface. The upper surface of the second planarization layer 180 may be parallel to the upper surface of the device substrate 100. A portion of the second planarization layer 180 overlapping with the driving circuit DC of each pixel area PA may have a thickness smaller than a portion of the second planarization layer 180 overlapping with the non-circuit area NC of the corresponding pixel area PA. For example, a first minimum distance d1 between the upper surface of the first planarization layer 170 and the upper surface of the second planarization layer 180 in the first circuit area A1 of each pixel area PA may be smaller than a second minimum distance d2 between the upper surface of the first planarization layer 170 and the upper surface of the second planarization layer 180 in the non-circuit area NC of the corresponding pixel area PA. The second minimum distance d2 of each pixel area PA may be larger than a third minimum distance d3 between the upper surface of the first planarization layer 170 and the upper surface of the second planarization layer 180 in the second circuit area A2 in the corresponding pixel area PA. A portion of the second planarization layer 180 overlapping with the connection electrode 250 may have a thickness smaller than a portion of the second planarization layer 180 overlapping with the non-circuit area NC.

The second conductive pattern 232 of each pixel area PA may be disposed closer to the device substrate 100 than the first source electrode, the first drain electrode, the second source electrode 224, and the second drain electrode 225 of the corresponding driving circuit DC. For example, the third minimum distance d3 of each pixel area PA may be larger than the first minimum distance d1 of the corresponding pixel area PA. The ratio between a thickness of the first planarization layer 170 and a thickness of the second planarization layer 180 on the driving circuit DC of each pixel area PA may be different from the ratio between a thickness of the first planarization layer 170 and a thickness of the second planarization layer 180 on the non-circuit area NC of the corresponding pixel area PA. For example, the thickness of the second planarization layer 180 compared to the thickness of the first planarization layer 170 on the first circuit area A1 of each pixel area PA may be smaller than the thickness of the second planarization layer 180 compared to the thickness of the first planarization layer 170 on the non-circuit area NC of the corresponding pixel area PA. The thickness of the second planarization layer 180 compared to the thickness of the first planarization layer 170 on the non-circuit area NC of each pixel area PA may be larger than the thickness of the second planarization layer 180 compared to the thickness of the first planarization layer 170 on the second circuit area A2 of the corresponding pixel area PA. The thickness of the second planarization layer 180 compared to the thickness of the first planarization layer 170 on the second circuit area A2 of each pixel area PA may be larger than the thickness of the second planarization layer 180 compared to the thickness of the first planarization layer 170 on the first circuit area A1 of the corresponding pixel area PA.

The light-emitting device 300 of each pixel area PA may emit light displaying a specific color. For example, the light-emitting device 300 of each pixel area PA may have a stacked structure of a first electrode 310, a light-emitting layer 320 and a second electrode 330.

The first electrode 310 may include a conductive material. The first electrode 310 may include a material having a high reflectance. For example, the first electrode 310 may include a metal, such as aluminum (Al) and silver (Ag). The first electrode 310 may have a multi-layer structure. For example, the first electrode 310 may have a structure in which a reflective electrode made of a metal is disposed between transparent electrodes made of a transparent conductive material, such as ITO and IZO. A thickness of the first electrode 310 may be constant. For example, the first electrode 310 may be a linear layer having a constant thickness extending along the upper surface of the device substrate 100.

The light-emitting layer 320 may generate light having luminance corresponding to a voltage difference between the first electrode 310 and the second electrode 330. For example, the light-emitting layer 320 may include an emission material layer (EML) having an emission material. The emission material may include an organic material, an inorganic material or a hybrid material. For example, the display apparatus according to the embodiment of the present disclosure may be an organic light-emitting display apparatus including an organic emission material.

The light-emitting layer 320 may have a multi-layer structure. For example, the light-emitting layer 320 may further include at least one of a hole injection layer (HIL), a hole transport layer (HTL), an electron transport layer (ETL) and an electron injection layer (EIL). Thus, in the display apparatus according to the embodiment of the present disclosure, the emission efficiency of the light-emitting layer 320 may be improved.

The second electrode 330 may include a conductive material. The second electrode 330 may include a material different from the first electrode 310. A transmittance of the second electrode 330 may be higher than a transmittance of the first electrode 310. For example, the second electrode 330 may be a transparent electrode made of a transparent conductive material, such as ITO and IZO. Thus, in the display apparatus according to the embodiment of the present disclosure, the light generated by the light-emitting layer 320 and the light reflected by the first electrode 310 may be emitted outside through the second electrode 330.

The light-emitting device 300 of each pixel area PA may be controlled independently of the light-emitting device 300 of the adjacent pixel area PA. For example, the first electrode 310 of each light-emitting device 300 may be spaced apart from the first electrode 310 of adjacent light-emitting device 300. A bank insulating layer 190 may be disposed between the first electrode 310 of each light-emitting device 300 and the first electrode 310 of adjacent light-emitting device 300. The bank insulating layer 190 may include an insulating material. For example, the bank insulating layer 190 may include an organic insulating material. The first electrode 310 of each light-emitting device 300 may be insulated from the first electrode 310 of adjacent light-emitting device 300 by the bank insulating layer 190. For example, the bank insulating layer 190 may cover an edge of the first electrode 310 in each pixel area PA.

The light-emitting layer 320 and the second electrode 330 of each light-emitting device 300 may be sequentially stacked on a portion of the first electrode 310 of the corresponding light-emitting device 300 exposed by the bank insulating layer 190. For example, the bank insulating layer 190 may define an emission area in each pixel area PA. The light-emitting layer 320 of each pixel area PA may be in direct contact with the first electrode 310 of the corresponding pixel area PA in the emission area of the corresponding pixel area PA.

The light-emitting device 300 of each pixel area PA may be disposed on the upper surface of the second planarization layer 180. For example, the first electrode 310, the light-emitting layer 320 and the second electrode 330 of the light-emitting device 300 in each pixel area PA may be sequentially stacked on the upper surface of the second planarization layer 180. The bank insulating layer 190 may be in direct contact with the upper surface of the second planarization layer 180 at the outside of the first electrode 310 in each pixel area PA. For example, the first electrode of each pixel area PA may be in direct contact with the upper surface of the second planarization layer 180 in the emission area of the corresponding pixel area PA. Thus, in the display apparatus according to the embodiment of the present disclosure, a vertical distance between the device substrate 100 and the light-emitting layer 320 in the emission area of each pixel area PA may be constant. That is, in the display apparatus according to the embodiment of the present disclosure, the generation position of the light emitted from the light-emitting device 300 of each pixel area PA may be the same. Therefore, in the display apparatus according to the embodiment of the present disclosure, luminance deviation due to differences in the generation position of the light emitted from the light-emitting device 300 of each pixel area PA may be prevented.

The first electrode 310 of each pixel area PA may be electrically connected to the driving circuit DC of the corresponding pixel area PA through the connection electrode 250 in the corresponding pixel area PA. For example, electrode contact holes partially exposing the connection electrode 250 of each pixel area PA may penetrate the first planarization layer 170 and the second planarization layer 180, and the first electrode 310 of each pixel area PA may be connected to the connection electrode 250 of the corresponding pixel area PA through one of the electrode contact holes. The driving current generated by the driving circuit DC of each pixel area PA may be supplied to the first electrode 310 of the corresponding pixel area PA. The electrode contact holes may overlap the bank insulating layer 190. Thus, in the display apparatus according to the embodiment of the present disclosure, curving a portion of the first electrode 310 in the emission area of each pixel area PA due to the electrode contact hole of the corresponding pixel area PA may be prevented. That is, in the display apparatus according to the embodiment of the present disclosure, a vertical distance between the device substrate 100 and the first electrode 310 in the emission area of each pixel area PA may be constant. Therefore, in the display apparatus according to the embodiment of the present disclosure, a deviation in the reflected-light visibility due to difference in the reflected position of the light emitted from the light-emitting layer 320 by the first electrode 310 in each pixel area PA may be prevented.

An encapsulation unit 400 may be disposed on the light-emitting device 300 of each pixel area PA. The encapsulation unit 400 may prevent damage of each light-emitting device 300 due to the external impact and moisture. For example, the second electrode 330 of each light-emitting device 300 may be completely covered by the encapsulation unit 400. The encapsulation unit 400 may include an insulating material. The encapsulation unit 400 may have a multi-layer structure. For example, the encapsulation unit 400 may have a stacked structure of a first encapsulating layer 410, a second encapsulating layer 420 and a third encapsulating layer 430. The second encapsulating layer 420 may include a material different from the first encapsulating layer 410 and the third encapsulating layer 430. For example, the first encapsulating layer 410 and the third encapsulating layer 430 may be an inorganic insulating material, and the second encapsulating layer 420 may be an organic insulating material. Thus, in the display apparatus according to the embodiment of the present disclosure, a thickness difference due to the light-emitting device 300 of each pixel area PA and the bank insulating layer 190 may be removed by the encapsulation unit 400.

The light-emitting layer 320 and the second electrode 330 of each light-emitting device 300 may extend on the bank insulating layer 190. For example, the light-emitting layer 320 and the second electrode 330 of each light-emitting device 300 may be connected to the light-emitting layer 320 and the second electrode 330 of adjacent light-emitting device 300. A voltage applied to the second electrode 330 of each light-emitting device 300 may be a same as a voltage applied to the second electrode 330 of adjacent light-emitting device 300. Thus, in the display apparatus according to the embodiment of the present disclosure, the luminance of the light emitted from each light-emitting device 300 may be adjusted by the driving current applied to the first electrode 310 of the corresponding light-emitting device 300. The light-emitting layer 320 of each light-emitting device 300 may include a same material as the light-emitting layer 320 of adjacent light-emitting device 300. For example, the light emitted from the light-emitting device 300 of each pixel area PA may display a same color as the light emitted from the light-emitting device 300 of adjacent pixel area PA.

Each of the pixel area PA may realize a color different from adjacent pixel area PA. For example, a black matrix 510 disposed outside the light-emitting devices 300 and color filters 520 overlapping with the light-emitting device 300 of each pixel area PA may be disposed on the encapsulation unit 400. The light by the light-emitting device 300 of each pixel area PA may emit outside through one of the color filters 520. The black matrix 510 may be disposed side by side with the color filters 520 on the encapsulation unit 400. For example, the black matrix 510 may overlap the bank insulating layer 190.

The color filter 520 on each pixel area PA may have a constant thickness. For example, an upper surface of the color filter 520 opposite to the device substrate 100 on each pixel area PA may be a flat surface. A vertical distance between the device substrate 100 and the upper surface of each color filter 520 may be constant. Thus, in the display apparatus according to the embodiment of the present disclosure, the color sense deviation of the light due to the thickness difference of the color filter 520 in each pixel area PA may be prevented.

A thickness of each color filter 520 may be the same as a thickness of adjacent color filter 520. For example, a vertical distance between the encapsulation unit 400 and the color filter 520 on each pixel area PA may be the same as a vertical distance between the encapsulation unit 400 and the color filter 520 on adjacent pixel area PA. Thus, in the display apparatus according to the embodiment of the present disclosure, the light passing through the color filter 520 of each pixel area PA may have a color sense same as the light passing through the color filter 520 of adjacent pixel area PA. Therefore, in the display apparatus according to the embodiment of the present disclosure, the generation of Mura due to the thickness deviation of the color filters 520 may be prevented.

An upper surface of the black matrix 510 opposite to the device substrate 100 may be a flat surface. The black matrix 510 may have a same thickness as the color filters 520. For example, the upper surface of the black matrix 510 may be continuously with the upper surface of each color filter 520. Thus, in the display apparatus according to the embodiment of the present disclosure, a thickness deviation due to a portion of each color filter 520 contacting a side of the black matrix 510 may be prevented.

FIGS. 4 to 14 are views sequentially showing a method of forming the display apparatus according to the embodiment of the present disclosure.

Figure 4:
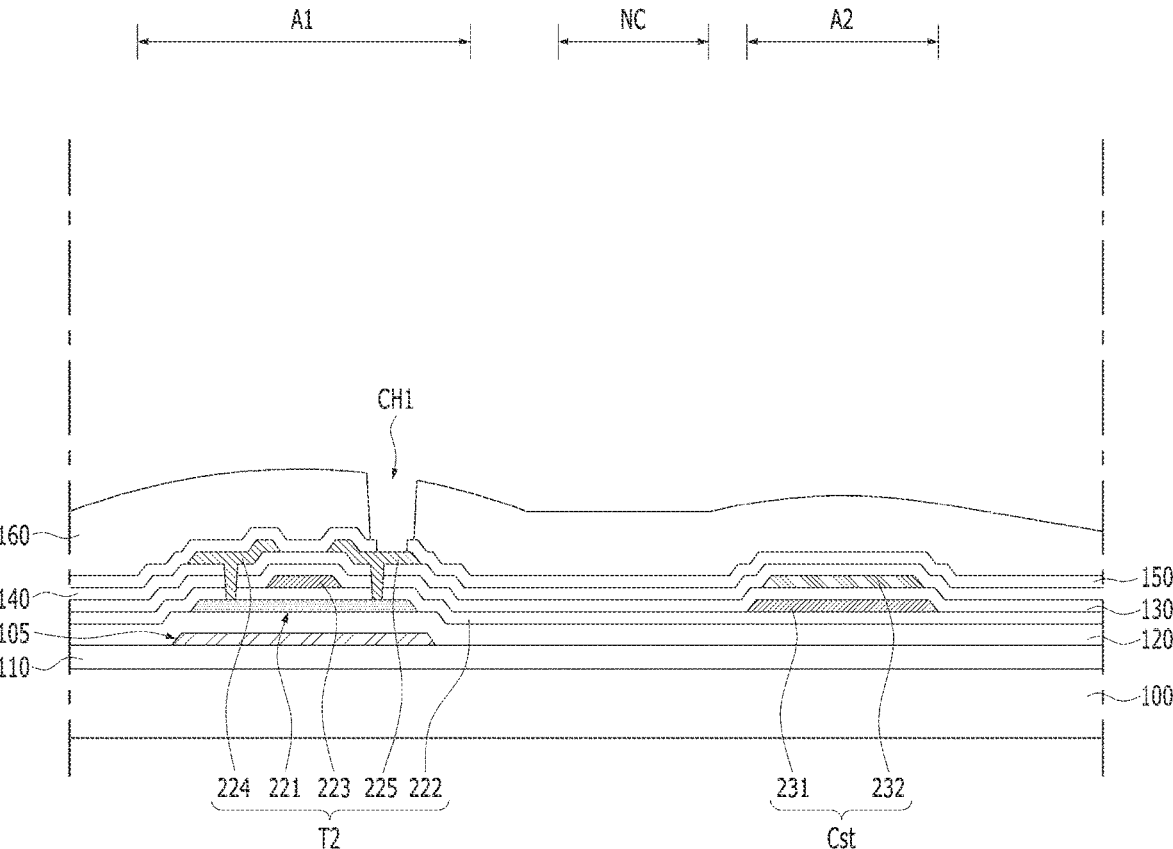
FIGS. 4 to 14 are views sequentially showing a method of forming the display apparatus according to the embodiment of the present disclosure.

The method of forming the display apparatus according to the embodiment of the present disclosure will be described with reference to FIGS. 3 to 14. First, the method of forming the display apparatus according to the embodiment of the present disclosure may include a step of preparing a device substrate 100 including a first circuit area A1, a second circuit area A2 and a non-circuit area NC; a step of forming a first buffer insulating layer 110 on an upper surface of the device substrate 100; a step of forming a light-blocking pattern 105 on the first buffer insulating layer 110 of the first circuit area A1; a step of forming a second buffer insulating layer 120 covering the light-blocking pattern 105 on the first buffer insulating layer 110; a step of forming a driving circuit that does not overlap the non-circuit area NC on the second buffer insulating layer 120; a step of forming a lower passivation layer 150 covering the driving circuit on the second buffer insulating layer 120; a step of forming an over-coat layer 160 on the lower passivation layer 150 and a step of forming a connection contact hole CH1 penetrating the lower passivation layer 150 and the over-coat layer 160, as shown in FIG. 4.

The first buffer insulating layer 110 and the second buffer insulating layer 120 may be formed of an insulating material. For example, the first buffer insulating layer 110 and the second buffer insulating layer 120 may be formed of an inorganic insulating material, such as silicon oxide (SiO) and silicon nitride (SiN). The second buffer insulating layer 120 may be formed of a material different from the first buffer insulating layer 110. For example, the second buffer insulating layer 120 may be formed to have a stacked structure different from the first buffer insulating layer 110.

The light-blocking pattern 105 may be formed of a material that absorbs or reflects light. For example, the light-blocking pattern 105 may include a metal, such as aluminum (Al), titanium (Ti), copper (Cu), molybdenum (Mo) and tungsten (W).

The non-circuit area NC may be disposed between the first circuit area A1 and the second circuit area A2. For example, the step of forming the driving circuit may include a step of forming a second thin film transistor T2 on the first circuit area A1 and a step of forming a storage capacitor Cst on the second circuit area A2.

The step of forming the second thin film transistor T2 may include a step of forming a second semiconductor pattern 221; a step of forming a second gate insulating layer 222 covering the second semiconductor pattern 221; a step of forming a second gate electrode 223 overlapping with a channel region of the second semiconductor pattern 221 on the second gate insulating layer 222; a step of forming a second source electrode 224 electrically connected to a source region of the second semiconductor pattern 221 and a step of forming a second drain electrode 225 electrically connected to a drain region of the second semiconductor pattern 221.

The second drain electrode 225 may be formed simultaneously with the second source electrode 224. The second source electrode 224 and the second drain electrode 225 may be formed on a layer different from the second gate electrode 223. For example, a first interlayer insulating layer 130 may be formed on the second gate electrode 223, a second interlayer insulating layer 140 may be formed on the first interlayer insulating layer 130, and the second source electrode 224 and the second drain electrode 225 may be formed on the second interlayer insulating layer 140.

The first interlayer insulating layer 130 and the second interlayer insulating layer 140 may be formed of an insulating material. For example, the first interlayer insulating layer 130 and the second interlayer insulating layer 140 may be formed of an inorganic insulating material, such as silicon oxide (SiO) and silicon nitride (SiN). The second interlayer insulating layer 140 may be formed of a material different from the first interlayer insulating layer 130.

The step of forming the storage capacitor Cst may include a step of forming a first conductive pattern 231 and a step of forming a second conductive pattern 232 on the first conductive pattern 231. The first conductive pattern 231 may be formed between the second gate insulating layer 222 and the first interlayer insulating layer 130. For example, the first conductive pattern 231 may be formed simultaneously with the second gate electrode 223. The first conductive pattern 231 may include a same material as the second gate electrode 223. The second conductive pattern 232 may be formed between the first interlayer insulating layer 130 and the second interlayer insulating layer 140. For example, the second conductive pattern 232 may be formed of a material different from the second source electrode 224 and the second drain electrode 225.

The lower passivation layer 150 may be formed of an insulating material. For example, the lower passivation layer 150 may be formed of an inorganic insulating material, such as silicon oxide (SiO) and silicon nitride (SiN). The lower passivation layer 150 may be formed to have a constant thickness. For example, the lower passivation layer 150 may be formed as a linear layer extending along an upper surface of the second thin film transistor T2 and an upper surface of the storage capacitor Cst, which are opposite to the device substrate 100.

The over-coat layer 160 may be formed of an insulating material. The over-coat layer 160 may be formed of a material different from the lower passivation layer 150. The over-coat layer 160 may be formed of a material capable of mitigate a thickness different due to the driving circuit. For example, the over-coat layer 160 may be formed of an organic insulating material. A thickness of the over-coat layer 160 may be not constant. For example, an upper surface of the over-coat layer 160 opposite to the device substrate 100 may have a curve due to the second thin film transistor T2 and the storage capacitor Cst.

The connection contact hole CH1 may expose partially a portion of the driving circuit. For example, the second drain electrode 225 of the second thin film transistor T2 may be partially exposed by the connection contact hole CH1.

Figure 5:
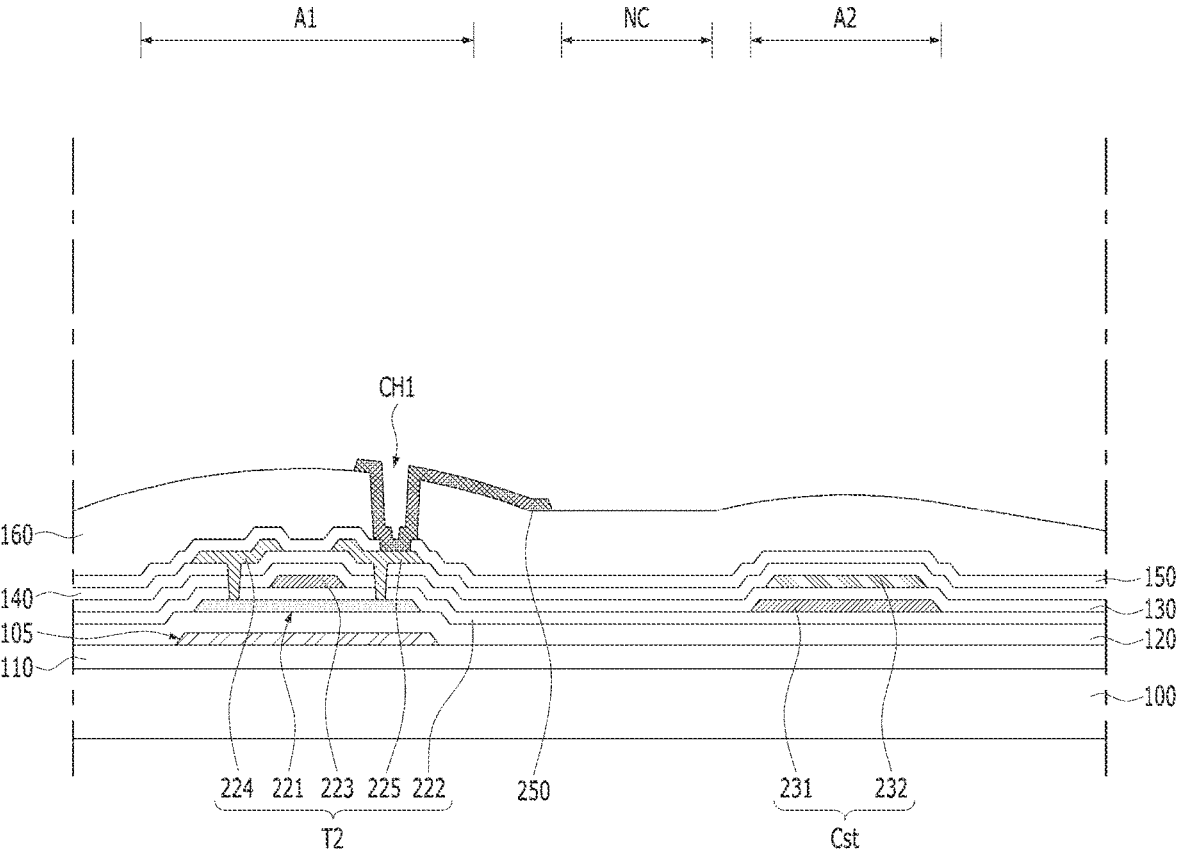

The method of forming the display apparatus according to the embodiment of the present disclosure may include a step of forming a connection electrode 250 on the over-coat layer 160, as shown in FIG. 5.

The connection electrode 250 may be formed of a conductive material. For example, the connection electrode 250 may be formed of a metal, such as aluminum (Al), titanium (Ti), copper (Cu), molybdenum (Mo) and tungsten (W). The connection electrode 250 may be electrically connected to the driving circuit. For example, the connection electrode 250 may be electrically connected to the second thin film transistor T2 through the connection contact hole CH1. The connection electrode 250 may include a region overlapping with the first circuit area A1. For example, the connection electrode 250 may be in direct contact with the second drain electrode 225 in the connection contact hole CH1.

The connection electrode 250 may be formed outside the non-circuit area NC. For example, the non-circuit area NC may be disposed among the second thin film transistor T2, the storage capacitor Cst and the connection electrode 250.

Figure 6:
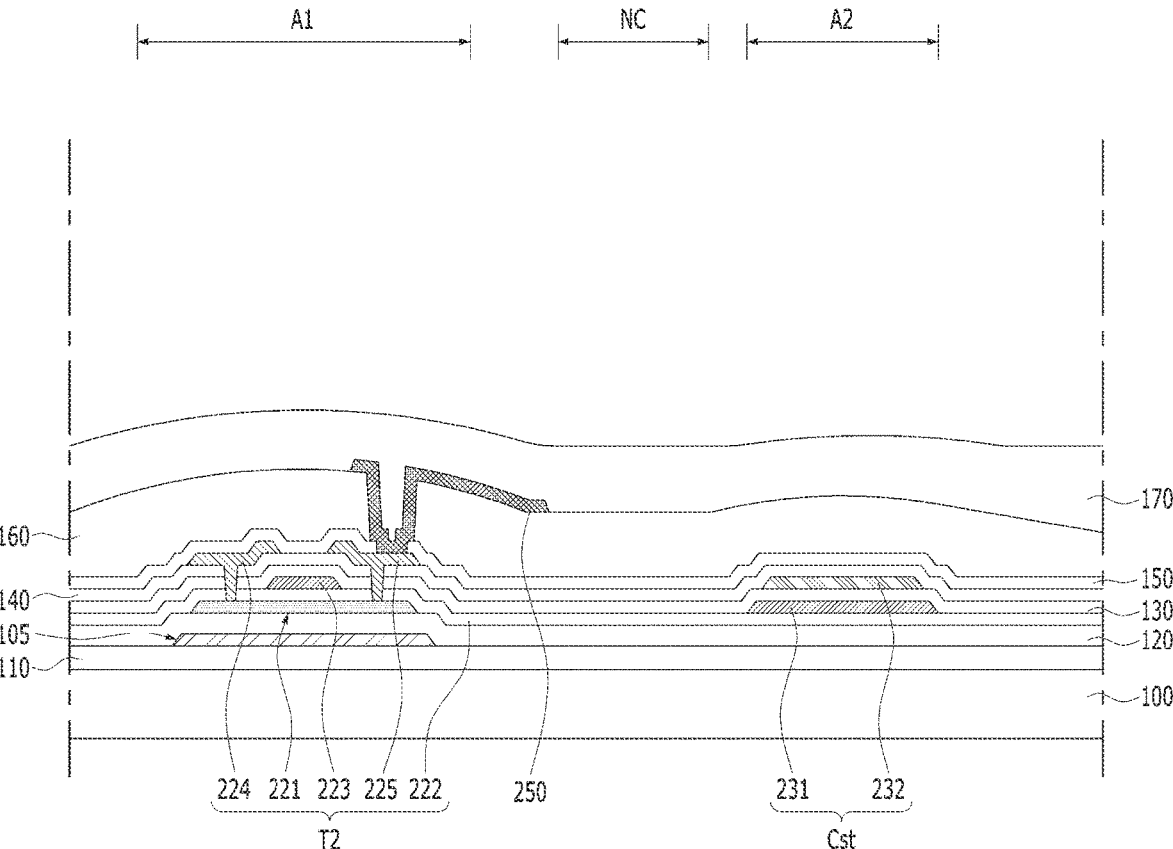

The method of forming the display apparatus according to the embodiment of the present disclosure may include a step of forming a first planarization layer 170 covering the connection electrode 250 on the over-coat layer 160, as shown in FIG. 6.

The first planarization layer 170 may be formed of an insulating material. For example, the first planarization layer 170 may be formed of an organic insulating material. The first planarization layer 170 may mitigate a thickness difference due to the connection electrode 250. The thickness different due to the second thin film transistor T2 and the storage capacitor Cst of the driving circuit may be mitigated by the over-coat layer 160 and the first planarization layer 170. For example, an upper surface of the first planarization layer 170 opposite to the device substrate 100 may have a more gentle curvature than the upper surface of the over-coat layer 160. The first planarization layer 170 may include a material different from the over-coat layer 160.

Figure 7:
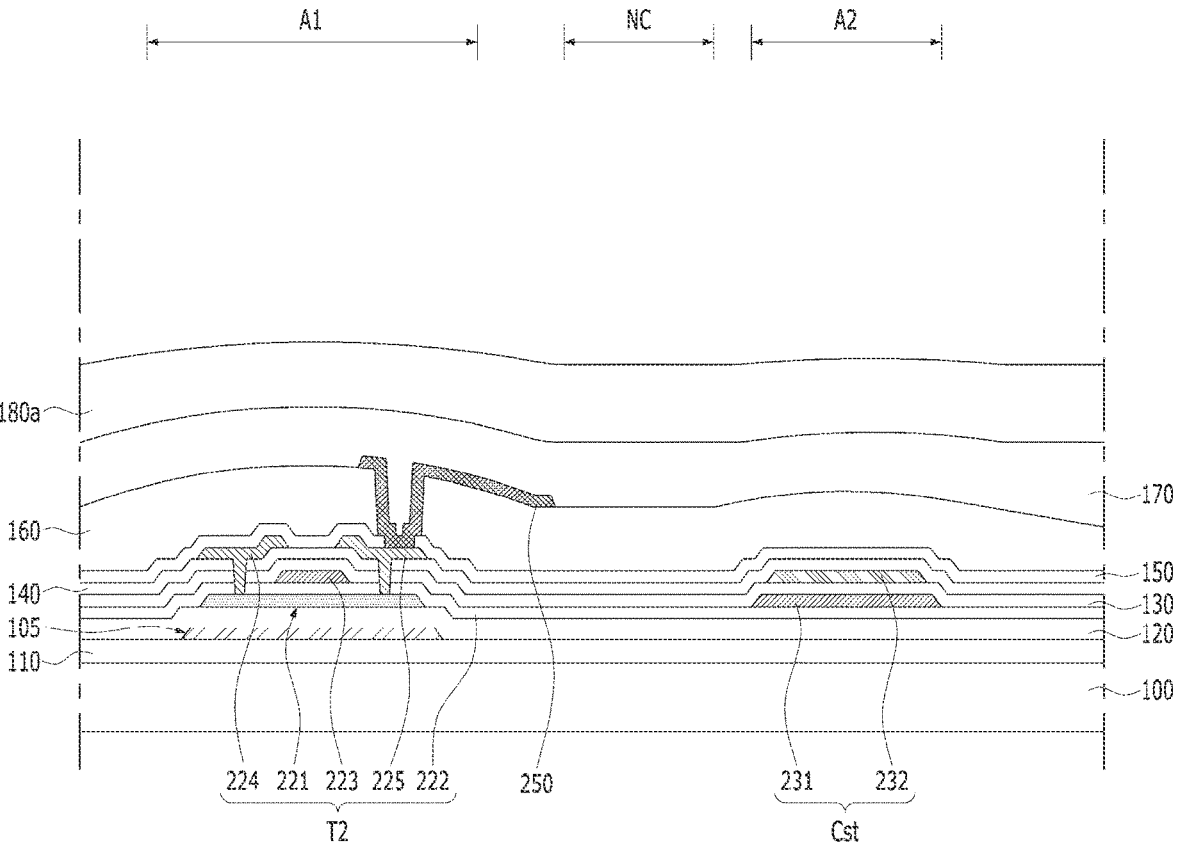

The method of forming the display apparatus according to the embodiment of the present disclosure may include a step of forming a preliminary planarization layer 180a on the first planarization layer 170, as shown in FIG. 7.

The preliminary planarization layer 180a may be formed of an insulating material. For example, the preliminary planarization layer 180a may be formed of an organic insulating material. A thickness difference due to the driving circuit and the connection electrode 250 may be further mitigated by the preliminary planarization layer 180a. For example, an upper surface of the preliminary planarization layer 180a opposite to the device substrate 100 may have a more gentle curvature than the upper surface of the first planarization layer 170.

Figure 8:
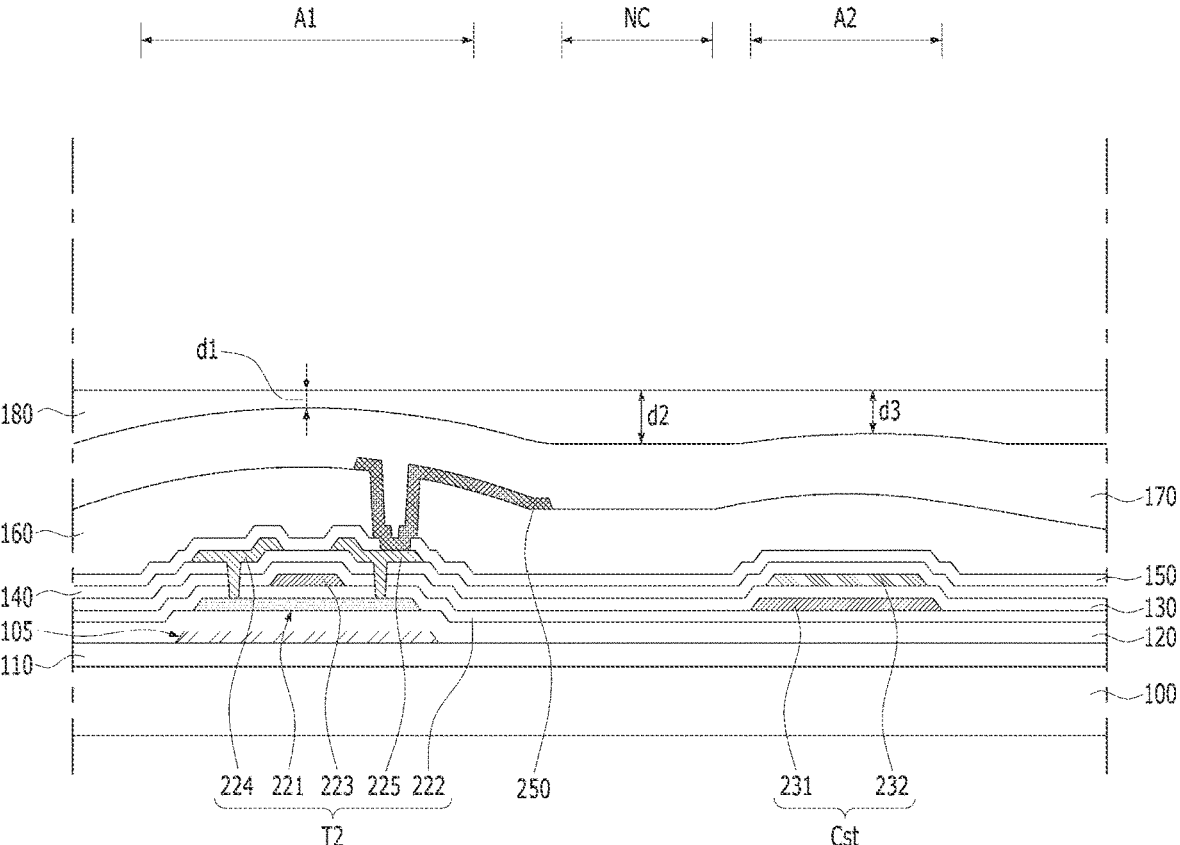

The method of forming the display apparatus according to the embodiment of the present disclosure may include a step of forming a second planarization layer 180 having a flat upper surface using the preliminary planarization layer 180a, as shown in FIG. 8.

The step of forming the second planarization layer 180 may include a step of planarizing the upper surface of the preliminary planarization layer 180a. A process of planarizing may include a chemical mechanical polishing (CMP) process. For example, the step of forming the second planarization layer 180 may include a step of partially removing an upper portion of the preliminary planarization layer 180a by the chemical mechanical polishing (CMP) process. Thus, in the method of forming the display apparatus according to the embodiment of the present disclosure, the first planarization layer 170 may be not exposed by a process of planarizing the upper surface of the preliminary planarization layer 180a.

The thickness difference due to the driving circuit and the connection electrode 250 may be completely removed by the second planarization layer 180. For example, the upper surface of the second planarization layer 180 may be formed to be parallel to the upper surface of the device substrate 100. A portion of the second planarization layer 180 overlapping with the first circuit area A1 and a portion of the second planarization layer 180 overlapping with the second circuit area A2 may have a thickness smaller than a portion of the second planarization layer 180 overlapping with the non-circuit area NC. For example, a first minimum distance d1 between the upper surface of the first planarization layer 170 and the upper surface of the second planarization layer 180 on the first circuit area A1 may be smaller than a second minimum distance d2 between the upper surface of the first planarization layer 170 and the upper surface of the second planarization layer 180 on the non-circuit area NC. The second minimum distance d2 may be larger than a third minimum distance d3 between the upper surface of the first planarization layer 170 and the upper surface of the second planarization layer 180 on the second circuit area A2.

The second conductive pattern 232 may be disposed closer to the device substrate 100 than the second source electrode 224 and the second drain electrode 225. For example, the third minimum distance d3 may be larger than the first minimum distance d1.

The ratio between a thickness of the first planarization layer 170 and a thickness of the second planarization layer 180 on the first circuit area A1 and the ratio between the thickness of the first planarization layer 170 and the thickness of the second planarization layer 180 on the second circuit area A2 may be different from the ratio between the thickness of the first planarization layer 170 and the thickness of the second planarization layer 180 on the non-circuit area NC. For example, the thickness of the second planarization layer 180 compared to the thickness of the first planarization layer 170 on the first circuit area A1 may be smaller than the thickness of the second planarization layer 180 compared to the thickness of the first planarization layer 170 on the non-circuit area NC. The thickness of the second planarization layer 180 compared to the thickness of the first planarization layer 170 on the non-circuit area NC may be larger than the thickness of the second planarization layer 180 compared to the thickness of the first planarization layer 170 on the second circuit area A2. The thickness of the second planarization layer 180 compared to the thickness of the first planarization layer 170 on the second circuit area A2 may be larger than the thickness of the second planarization layer 180 compared to the thickness of the first planarization layer 170 on the first circuit area A1.

A stress applied to the driving circuit in a process of planarizing the preliminary planarization layer 180a may be mitigated by the first planarization layer 170. For example, the first planarization layer 170 may have the rigidity higher than the second planarization layer 180. The first planarization layer 170 may include a material different from the second planarization layer 180. Thus, in the method of forming the display apparatus according to the embodiment of the present disclosure, the damage of the second thin film transistor T2 and the storage capacitor Cst of the driving circuit due to a process of forming the second planarization layer 180 may be prevented.

Figure 9:
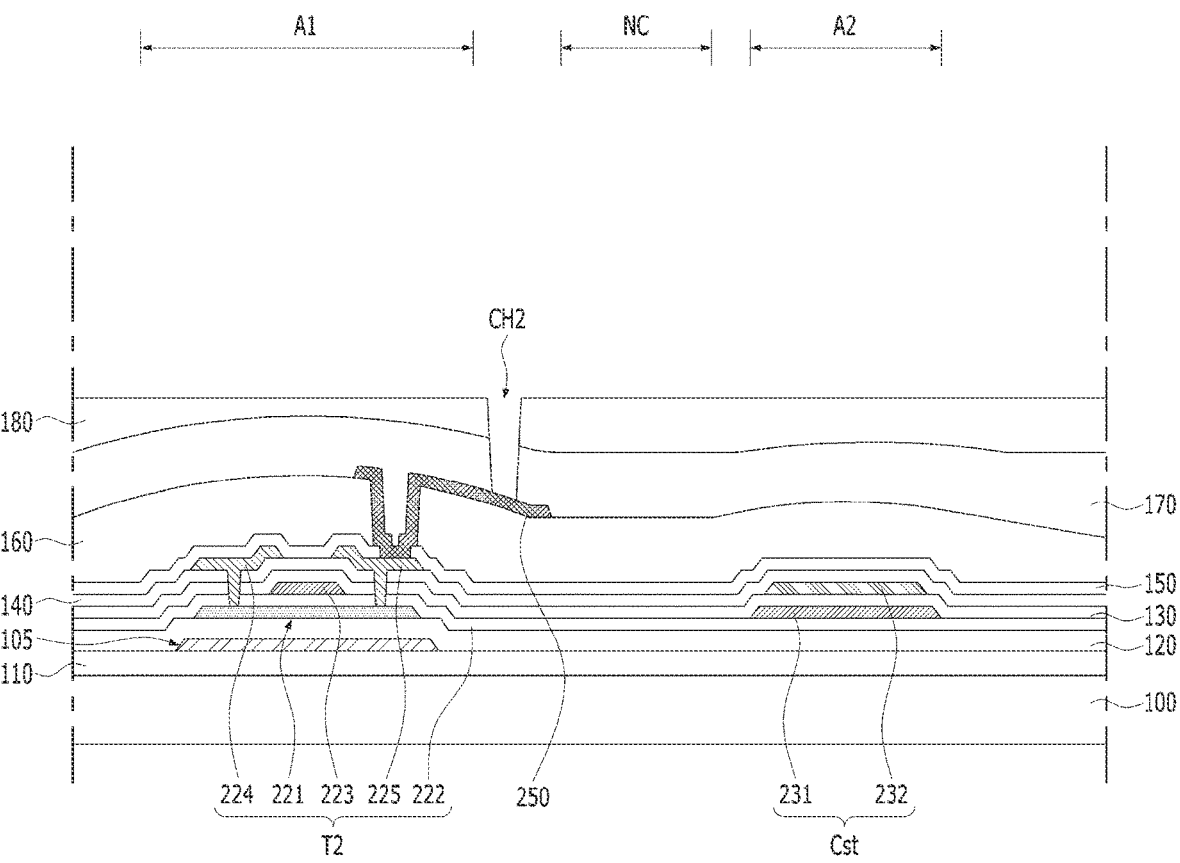

The method of forming the display apparatus according to the embodiment of the present disclosure may include a step of forming an electrode contact hole CH2 penetrating the first planarization layer 170 and the second planarization layer 180, as shown in FIG. 9.

The electrode contact hole CH2 may be formed on the connection electrode 250. For example, the electrode contact hole CH2 may expose a portion of the connection electrode 250. The electrode contact hole CH2 may be formed outside the non-circuit area NC.

Figure 10:
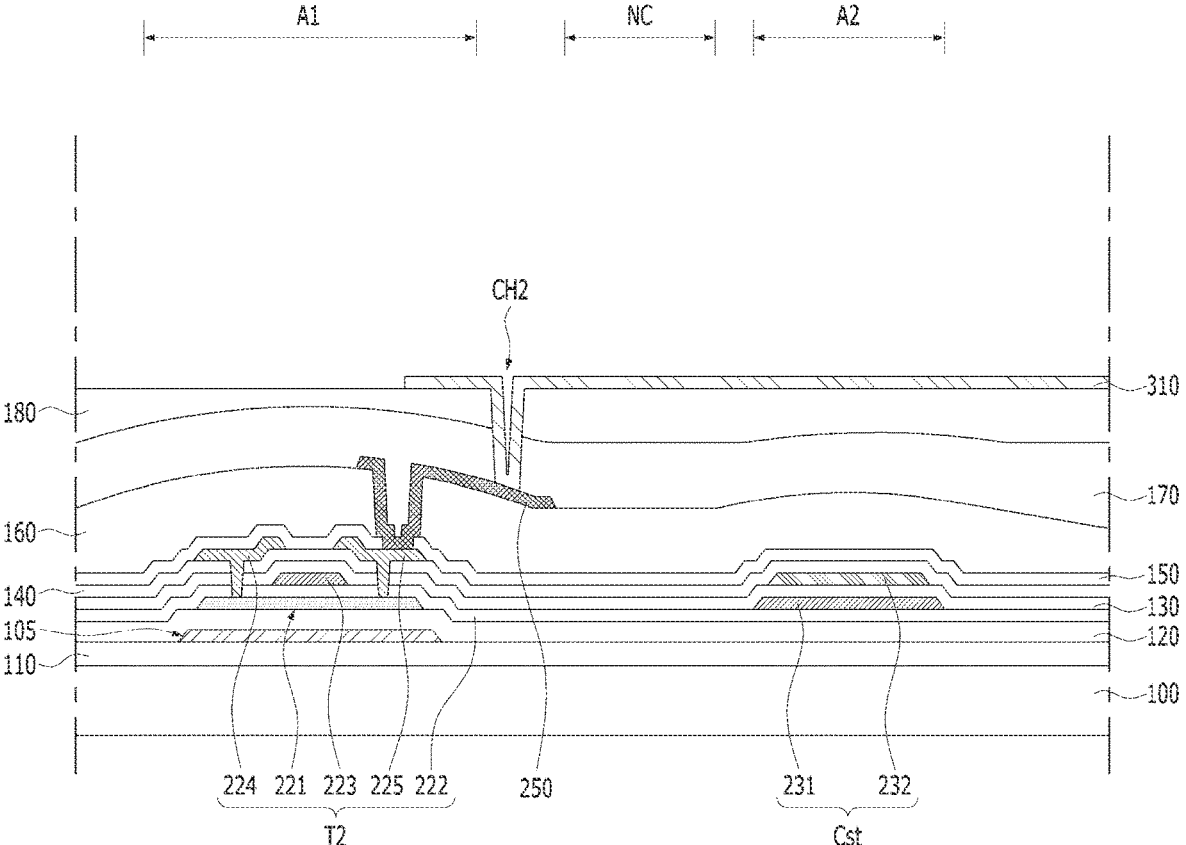

The method of forming the display apparatus according to the embodiment of the present disclosure may include a step of forming a first electrode 310 electrically connected to the second drain electrode 250 through the electrode contact hole CH2, as shown in FIG. 10.

The first electrode 310 may be formed of a conductive material. The first electrode 310 may be formed of a material having a high reflectance. For example, the first electrode 310 may be formed of a metal, such as aluminum (Al) and silver (Ag). The first electrode 310 may be formed to have a constant thickness. For example, the step of forming the first electrode 310 may include a step of forming a metal layer having a constant thickness on the upper surface of the second planarization layer in which the electrode contact hole CH2 is formed, and a step of forming the first electrode 310 by patterning the metal layer. The first electrode 310 may be formed in a multi-layer structure.

The first electrode 310 may be formed on the upper surface of the second planarization layer 180. A lower surface of the first electrode 310 toward the device substrate 100 may be in direct contact with the upper surface of the second planarization layer 180 at the outside of the electrode contact hole CH2. For example, the lower surface of the first electrode 310 may be parallel to the upper surface of the second planarization layer 180 at the outside of the electrode contact hole CH2.

Figure 11:
Figure 11:
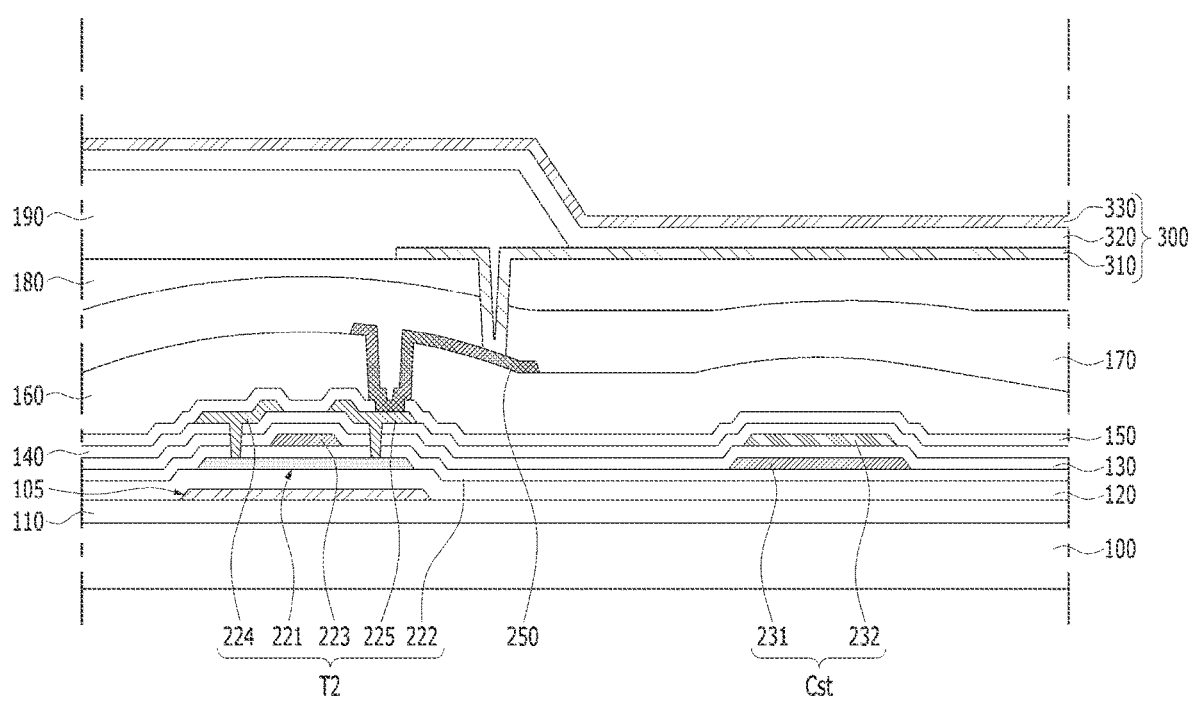

The method of forming the display apparatus according to the embodiment of the present disclosure may include a step of forming a bank insulating layer 190 covering an edge of the first electrode 310 on the second planarization layer 180, and a step of sequentially stacking a light-emitting layer 320 and a second electrode 330 on a portion of the first electrode 310 exposed by the bank insulating layer 190, as shown in FIG. 11.

The bank insulating layer 190 may be formed of an insulating material. For example, the bank insulating layer 190 may be formed of an organic insulating material. The bank insulating layer 190 may be formed to overlap the electrode contact hole CH2. For example, the portion of the first electrode 310 exposed by the bank insulating layer 190 may be disposed outside the electrode contact hole CH2.

The first electrode 310, the light-emitting layer 320 and the second electrode 330 may configure the light-emitting device 300. For example, the bank insulating layer 190 may define an emission area in which light is emitted from the light-emitting device 300. The light-emitting layer 320 may be in direct contact with the portion of the first electrode 310 in the emission area defined by the bank insulating layer 190. Thus, in the method of forming the display apparatus according to the embodiment of the present disclosure, a vertical distance between the device substrate 100 and the light-emitting layer 320 in the emission area may be constant. That is, in the method of forming the display apparatus according to the embodiment of the present disclosure, the generation position of the light by the light-emitting layer 320 may be the same in the emission area. Therefore, in the method of forming the display apparatus according to the embodiment of the present disclosure, the luminance deviation due to difference in the generation position of the light emitted from the light-emitting device 300 may be prevented. And, in the method of forming the display apparatus according to the embodiment of the present disclosure, a deviation of the reflected-light visibility due to difference in the reflected position of the light generated by the light-emitting layer 320 by the first electrode 310 may be prevented.

Figure 12:
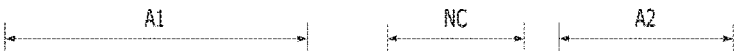
Figure 12:
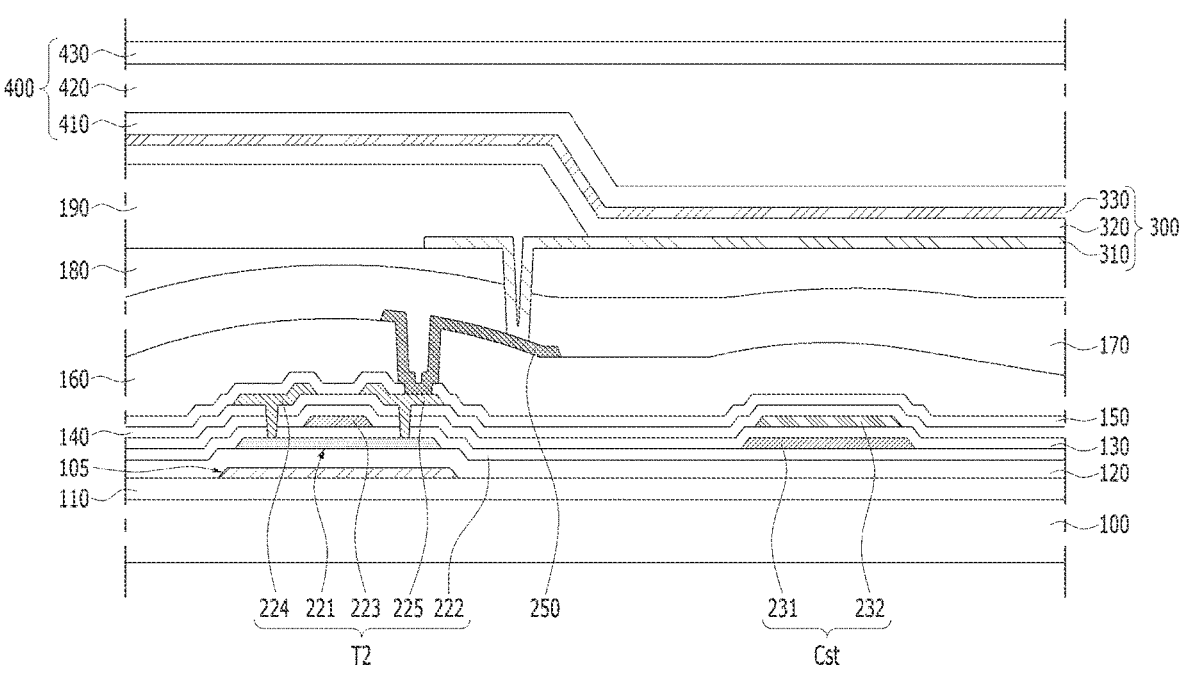

The method of forming the display apparatus according to the embodiment of the present disclosure may include a step of forming an encapsulation unit 400 on the device substrate 100 in which the light-emitting device 400 is formed, as shown in FIG. 12.

The second electrode 330 of the light-emitting device 300 may be completely covered by the encapsulation unit 400. For example, the encapsulation unit 400 may overlap the first circuit area A1, the second circuit area A2 and the non-circuit area NC of the device substrate 100. The bank insulating layer 190 may overlap the encapsulation unit 400. The encapsulation unit 400 may be formed in a multi-layer structure. For example, the encapsulation unit 400 may be formed in a stacked structure of a first encapsulating layer 410, a second encapsulating layer 420 and a third encapsulating layer 430.

The first encapsulating layer 410, the second encapsulating layer 420 and the third encapsulating layer 430 may be formed of an insulating material. The second encapsulating layer 420 may be formed of a material different from the first encapsulating layer 410 and the third encapsulating layer 430. For example, the first encapsulating layer 410 and the third encapsulating layer 430 may be formed of an inorganic insulating material, and the second encapsulating layer 420 may be formed of an organic insulating material. Thus, in the method of forming the display apparatus according to the embodiment of the present disclosure, a thickness difference due to the light-emitting device 300 and the bank insulating layer 190 may be removed by the encapsulation unit 400.

Figure 13:
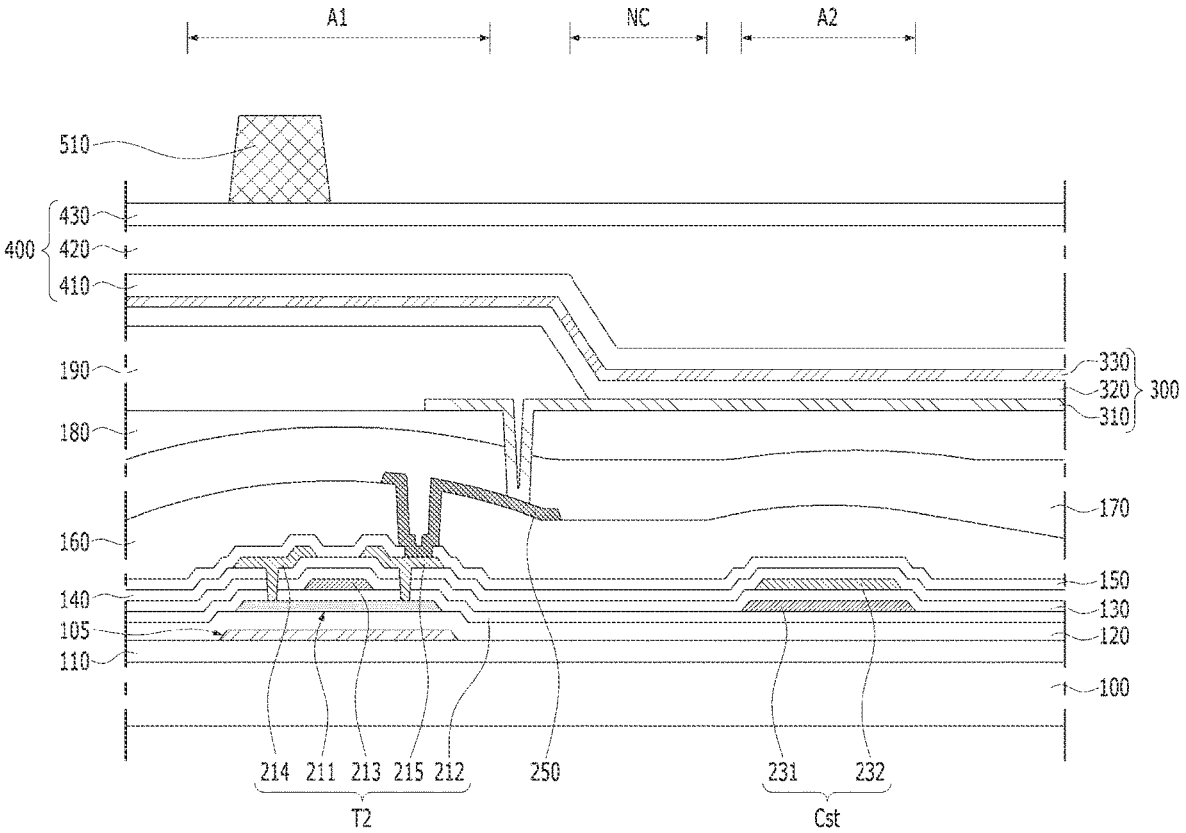

The method of forming the display apparatus according to the embodiment of the present disclosure may include a step of forming a black matrix 510 on the encapsulation unit 400, as shown in FIG. 13.

The black matrix 510 may be formed outside the emission area defined by the bank insulating layer 190. For example, the black matrix 510 may be formed on the bank insulating layer 190. The light-emitting device 300 may not overlap the black matrix 510. The black matrix 510 may be formed of a material that absorbs or blocks light. For example, the black matrix 510 may include a black dye.

Figure 14:
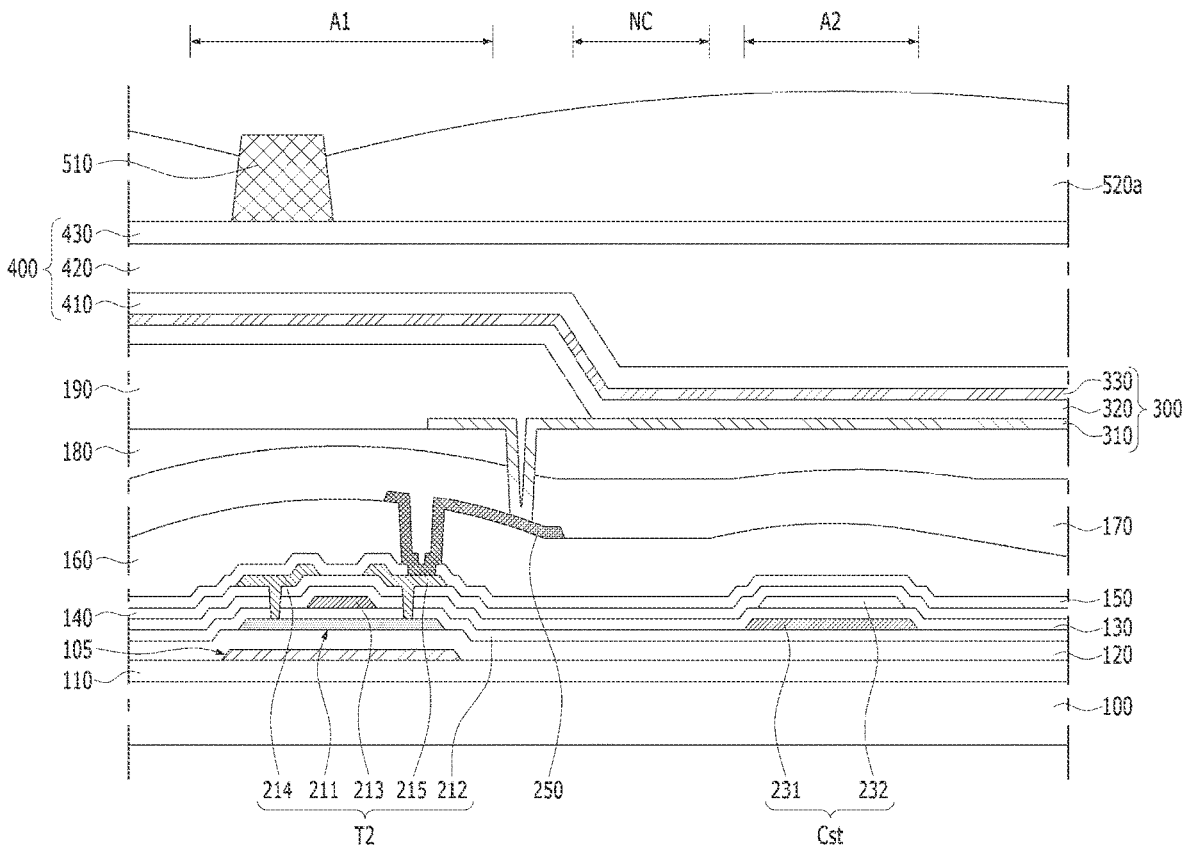

The method of forming the display apparatus according to the embodiment of the present disclosure may include a step of preliminary color filter 520a on the encapsulation unit 400 exposed by the black matrix 510, as shown in FIG. 14.

The preliminary color filter 520a may be formed to overlap the emission area. For example, the light by the light-emitting device 300 may be emitted outside through the preliminary color filter 520a. The preliminary color filter 520a may be disposed side by side with the black matrix 510 on the encapsulation unit 400. The preliminary color filter 520a may be formed by an inkjet process. For example, the step of forming the preliminary color filter 520a may include a step of spraying a material for forming the preliminary color filter 520a in a region defined by the black matrix 510 using a plurality of nozzles. An upper surface of the preliminary color filter 520a opposite to the device substrate 100 may be formed in a semicircular shape.

The method of forming the display apparatus according to the embodiment of the present disclosure may include a step of forming a color filter 520 using the preliminary color filer 520a, as shown in FIG. 3.

The color filter 520 may have a constant thickness. For example, the step of forming the color filter 520 may include a step of planarizing the upper surface of the preliminary color filter 520a. For example, the step of forming the color filter 520 may include a step of partially removing an upper portion of the preliminary color filter 520a by the chemical mechanical polishing (CMP) process. An upper surface of the color filter 520 opposite to the device substrate 100 may be a flat surface. For example, the upper surface of the color filter 520 may be parallel to the upper surface of the device substrate 100. Thus, in the method of forming the display apparatus according to the embodiment of the present disclosure, the color sense deviation due to the thickness difference of the color filter 520 may be prevented. Therefore, in the method of forming the display apparatus according to the embodiment of the present disclosure, the generation of Mura due to the color sense deviation may be prevented.

The step of forming the color filter 520 may include a step of planarizing an upper surface of the black matrix 510 opposite to the device substrate 100. For example, the upper surface of the black matrix 510 may be planarized by a process of planarizing the upper surface of the preliminary color filter 520a. Thus, in the method of forming the display apparatus according to the embodiment of the present disclosure, the upper surface of the black matrix 510 may be continuously with the upper surface of the color filter 520. For example, in the method of forming the display apparatus according to the embodiment of the present disclosure, the color filter may have a same thickness as the black matrix 510. Therefore, in the method of forming the display apparatus according to the embodiment of the present disclosure, a thickness deviation of the color filter 520 due to a portion of the color filter 520 contacting a side of the black matrix 510 may be prevented.

Accordingly, the display apparatus according to the embodiment of the present disclosure and the method of forming the same may include the first planarization layer 170 and the second planarization layer 180 formed on the driving circuit DC and the connection electrode 250 of each pixel area PA, wherein the upper surface of the second planarization layer 180 opposite to the device substrate 100 may be a flat. Thus, in the display apparatus according to the embodiment of the present disclosure and the method of forming the same, the generation position of the light by the light-emitting layer 320 of each pixel area PA and the reflected position of the light by the first electrode 310 of each pixel area PA, which are disposed on the upper surface of the second planarization layer may be the same. Therefore, in the display apparatus according to the embodiment of the present disclosure and the method of forming the same, the luminance deviation and the deviation of the reflected-light visibility in each pixel area PA may be prevented. That is, in the display apparatus according to the embodiment of the present disclosure and the method of forming the same, decreasing the quality of the image may be prevented.

And, in the display apparatus according to the embodiment of the present disclosure and the method of forming the same, the color filter 520 of each pixel area PA on the encapsulation unit 400 may have a flat upper surface. Thus, in the display apparatus according to the embodiment of the present disclosure and the method of forming the same, the color sense deviation and the generation of Mura due to the thickness difference of the color filters 520 may be prevented.

Further, in the display apparatus according to the embodiment of the present disclosure and the method of forming the same, the upper surface of the second planarization layer 180 on the first planarization layer 170 may be planarized by the chemical mechanical polishing (CMP) process. Thus, in the display apparatus according to the embodiment of the present disclosure and the method of forming the same, increasing an entire thickness due to the first planarization layer 170 and the second planarization layer 180 may be minimized, and the damage of the driving circuit due to a process of forming the second planarization layer 180 may be prevented. Therefore, in the display apparatus according to the embodiment of the present disclosure and the method of forming the same, decreasing the reliability and the quality of the image may be effectively prevented.

The display apparatus according to the embodiment of the present disclosure is described that the gate driver GD, the data driver DD, the power unit PU and the timing controller TC are disposed outside the display panel DP, the plurality of the pixel areas PA are disposed in a display area AA of the display panel DP, and the gate driver GD, the data driver DD, the power unit PU and the timing controller TC are electrically connected to each pixel area PA through signal wirings DL, GL, PL and RL crossing a bezel area BZ of the display panel DP, which is disposed outside the display area AA. However, in the display apparatus according to another embodiment of the present disclosure, at least one of the gate driver GD, the data driver DD, the power unit PU and the timing controller TC may be formed on the bezel area BZ of the display panel DP. For example, the display apparatus according to another embodiment of the present disclosure may be a GIP (Gate In Panel) type display apparatus in which the gate driver GD is formed on the bezel area BZ of the display panel DP.

Figure 15:
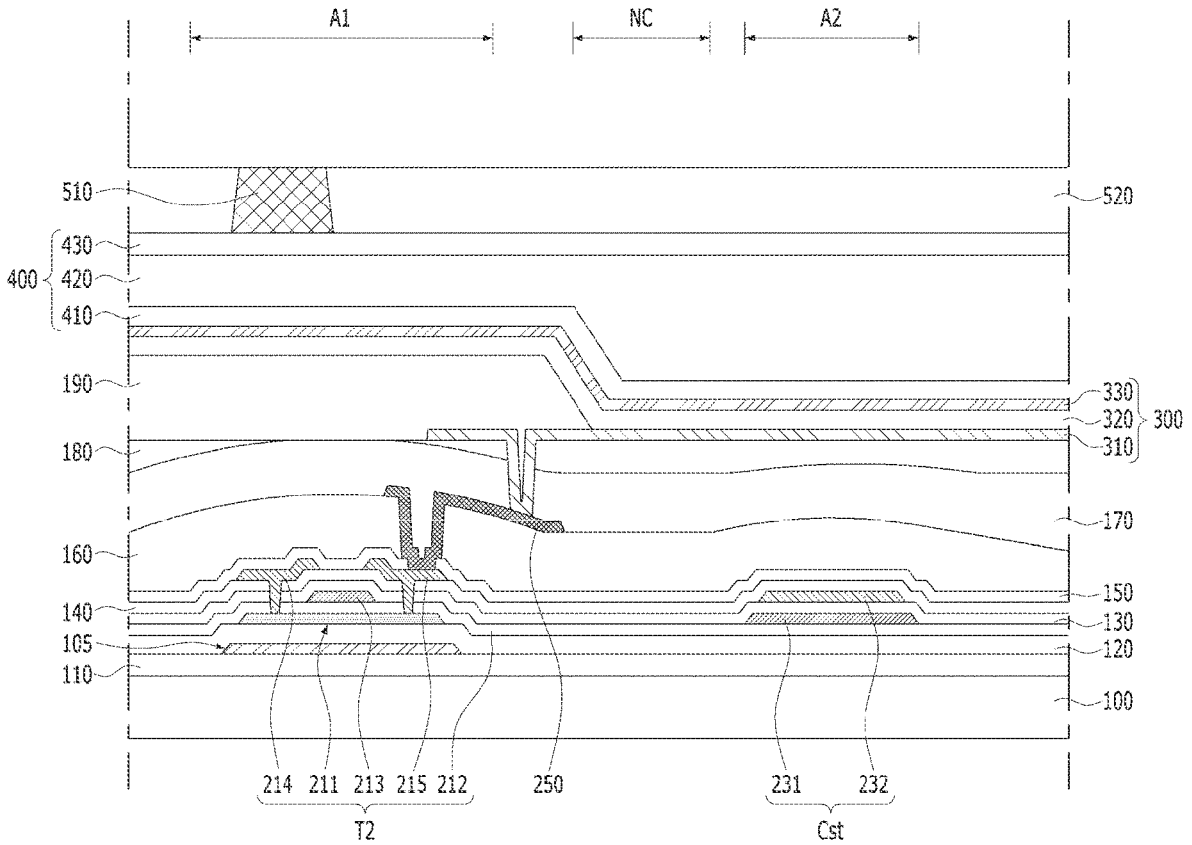
FIGS. 15 and 16 are views showing the display apparatus according to another embodiment of the present disclosure.

The display apparatus according to the embodiment of the present disclosure is described that the upper surface of the first planarization layer 170 is completely covered by the second planarization layer 180. However, in the display apparatus according to another embodiment of the present disclosure, the second planarization layer 180 may partially exposed the first planarization layer 170. For example, in the display apparatus according to another embodiment of the present disclosure, a portion of the first planarization layer 170 on the first circuit area A1 may be exposed by the second planarization layer 180, as shown in FIG. 15. Thus, in the display apparatus according to another embodiment of the present disclosure, increasing the entire thickness due to a height deviation of the first planarization layer 170 may be minimized. Therefore, in the display apparatus according to another embodiment of the present disclosure, decreasing the quality of the image may be effectively prevented.

Figure 16:
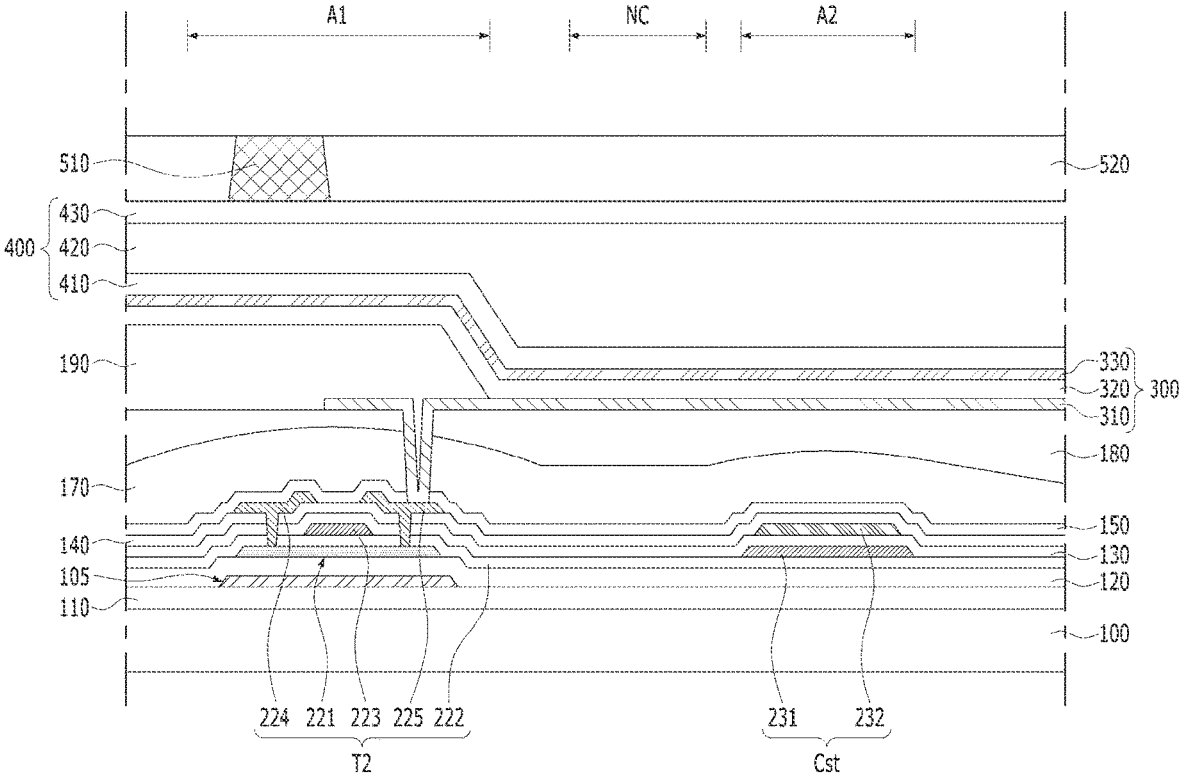

The display apparatus according to the embodiment of the present disclosure is described that the first electrode 310 of each pixel area PA is electrically connected to the second thin film transistor T2 of the corresponding pixel area PA by one of the connection electrodes 250. However, in the display apparatus according to another embodiment of the present disclosure, the first electrode 310 of each pixel area PA may be in direct contact with the second drain electrode 225 of the corresponding pixel area PA. For example, in the display apparatus according to another embodiment of the present disclosure, the first planarization layer 170 and the second planarization layer 180 may be sequentially stacked between the lower passivation layer 150 and the light-emitting device 300 of each pixel area PA, and the first electrode 310 of each pixel area PA may be connected to the second drain electrode 225 of the corresponding pixel area PA by penetrating the lower passivation layer 150, the first planarization layer 170 and the second planarization layer 180, as shown in FIG. 16. Thus, in the display apparatus according to another embodiment of the present disclosure, regardless of the structure between the device substrate 100 and the first planarization layer 170, the luminance deviation and the deviation of the reflected-light visibility in each pixel area PA may be prevented. Therefore, in the display apparatus according to another embodiment of the present disclosure, the degree of freedom for the configuration of the driving circuit DC disposed in each pixel area PA may be improved.

In the result, the display apparatus according to the embodiments of the present disclosure and the method of forming the same may comprise forming the first planarization layer covering the driving circuit on the device substrate, forming the second planarization layer by planarizing the upper surface of the preliminary planarization layer disposed on the first planarization layer, and forming the light-emitting device on the flat upper surface of the second planarization layer. Thus, in the display apparatus according to the embodiments of the present disclosure and the method of forming the same, the generation position of the light emitted from the light-emitting device may be the same in the emission area. Thereby, in the display apparatus according to the embodiments of the present disclosure and the method of forming the same, decreasing the quality of the image may be prevented.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus comprising:
a device substrate including a first circuit area and a non-circuit area outside the first circuit area;
a thin film transistor on the first circuit area of the device substrate;
a first planarization layer on the thin film transistor, the first planarization layer extending on the non-circuit area;

a second planarization layer on the first planarization layer, an upper surface of the second planarization layer opposite to the device substrate being a flat surface; and a light-emitting device on the upper surface of the second planarization layer, the light-emitting device having a stacked structure of a first electrode, a light-emitting layer and a second electrode, wherein a first minimum distance between an upper surface of the first planarization layer opposite to the device substrate and the upper surface of the second planarization layer in the first circuit area is smaller than a second minimum distance between the upper surface of the first planarization layer and the upper surface of the second planarization layer in the non-circuit area.

2. The display apparatus according to claim 1, wherein the first electrode of the light-emitting device is in contact with the upper surface of the second planarization layer.

3. The display apparatus according to claim 1, further comprising:

an over-coat layer disposed between the thin film transistor and the first planarization layer, the over-coat layer extending on the non-circuit area; and a connection electrode disposed between the over-coat layer and the first planarization layer, the connection electrode electrically connected to the thin film transistor, wherein the non-circuit area of the device substrate is outside the connection electrode.

4. The display apparatus according to claim 3, wherein the upper surface of the first planarization layer has a more gentle curvature than an upper surface of the over-coat layer opposite to the device substrate.

5. The display apparatus according to claim 3, wherein a portion of the second planarization layer overlapping with the connection electrode has a thickness smaller than a portion of the second planarization layer overlapping with the non-circuit area.

6. The display apparatus according to claim 1, wherein the second planarization layer includes a material different from the first planarization layer.

7. The display apparatus according to claim 1, further comprising a storage capacitor disposed on a second circuit area of the device substrate and the first planarization layer, wherein the second circuit area is outside the first circuit area and the non-circuit area, and wherein a third minimum distance between the upper surface of the first planarization layer and the upper surface of the second planarization layer in the second circuit area is smaller than the second minimum distance.

8. The display apparatus according to claim 7, wherein the third minimum distance is larger than the first minimum distance.

9. The display apparatus according to claim 1, further comprising:

an encapsulation unit on the light-emitting device, the encapsulation unit overlapping with the first circuit area and the non-circuit area; and a color filter on the encapsulation unit, the color filter overlapping with the light-emitting device, wherein an upper surface of the color filter opposite to the device substrate is a flat surface.

10. The display apparatus according to claim 9, further comprising a black matrix disposed side by side with the color filter, wherein an upper surface of the black matrix opposite to the device substrate is continuously with the upper surface of the color filter.

11. A method of forming a display apparatus comprising:

preparing a device substrate including a circuit area and a non-circuit area spaced apart from the circuit area;

forming a driving circuit on the circuit area of the device substrate;

forming a first planarization layer covering the driving circuit and overlapping with the non-circuit area on the device substrate;

forming a preliminary planarization layer on the first planarization layer;

forming a second planarization layer having a flat upper surface by planarizing an upper surface of the preliminary planarization layer opposite to the device substrate; and forming a light-emitting device on the upper surface of the second planarization layer.

12. The method of forming the display apparatus according to claim 11, wherein forming the second planarization layer includes planarizing the upper surface of the preliminary planarization layer by chemical mechanical polishing (CMP) process.

13. The method of forming the display apparatus according to claim 11, further comprising:

forming an encapsulation unit covering the light-emitting device on the device substrate;

forming a black matrix outside the light-emitting device on the encapsulation unit;

forming a preliminary color filter overlapping with the light-emitting device in a region defined by the black matrix; and forming a color filter having a flat upper surface by planarizing an upper surface of the preliminary color filter opposite to the device substrate.

14. The method of forming the display apparatus according to claim 13, wherein an upper surface of the black matrix is continuously with the upper surface of the color filter by a process of planarizing the upper surface of the preliminary color filter.

15. The method of forming the display apparatus according to claim 11, further comprising:

forming an over-coat layer covering the driving circuit between the device substrate and the first planarization layer; and forming a connection electrode electrically connected to the driving circuit between the over-coat layer and the first planarization layer, wherein the light-emitting device is formed to be electrically connected to the connection electrode by penetrating the first planarization layer and the second planarization layer.

16. A display apparatus comprising:

a device substrate on which a plurality of pixel areas are defined;

a thin film transistor on the device substrate;

an over-coat layer disposed on the thin film transistor;

a first planarization layer disposed on the over-coat layer; and a second planarization layer on the first planarization layer, an upper surface of the second planarization layer being a flat surface; and a light-emitting device on an upper surface of the planarization layer, wherein an upper surface of the over-coat layer and an upper surface the first planarization layer have a shape different from the upper surface of the second planarization layer, and wherein the first planarization layer has a more gentle curvature than an upper surface of the over-coat layer.

17. The display apparatus according to claim 16, wherein the device substrate includes a first circuit area in which the thin film transistor is disposed, and a non-circuit area disposed outside the thin film transistor, and wherein a portion of the upper surface of the first planarization layer on the first circuit area is disposed closer to the upper surface of the second planarization layer than a portion of the upper surface of the first planarization layer on the non-circuit area.

18. The display apparatus according to claim 17, wherein the device substrate further includes a second circuit area in which a storage capacitor is disposed, wherein the non-circuit area is disposed outside the storage capacitor, wherein a portion of the upper surface of the first planarization layer on the second circuit area is disposed closer to the upper surface of the second planarization layer than the portion of the upper surface of the first planarization layer on the non-circuit area, and wherein the portion of the upper surface of the first planarization layer on the first circuit area is disposed closer to the upper surface of the second planarization layer than the portion of the upper surface of the first planarization layer on the second circuit area.

* * * * *